(12) United States Patent
Richardson et al.

(10) Patent No.: US 11,303,303 B2
(45) Date of Patent: Apr. 12, 2022

(54) RATE 7/8 LOW-DENSITY PARITY-CHECK (LDPC) CODE

(71) Applicant: QUALCOMM Incorporated, San Diego, CA (US)

(72) Inventors: Thomas Joseph Richardson, South Orange, NJ (US); Dung Ngoc Doan, San Diego, CA (US); Didier Johannes Richard Van Nee, Tull en 't Waal (NL); Lin Yang, San Diego, CA (US); Bin Tian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/130,162

(22) Filed: Dec. 22, 2020

(65) Prior Publication Data

US 2021/0211143 A1    Jul. 8, 2021

Related U.S. Application Data

(60) Provisional application No. 62/956,917, filed on Jan. 3, 2020.

(51) Int. Cl.
| | | |
|---|---|---|
| *H03M 13/25* | (2006.01) | |
| *H03M 13/11* | (2006.01) | |
| *H03M 13/37* | (2006.01) | |
| *H03M 13/00* | (2006.01) | |

(52) U.S. Cl.
CPC ....... *H03M 13/255* (2013.01); *H03M 13/116* (2013.01); *H03M 13/3761* (2013.01); *H03M 13/6393* (2013.01)

(58) Field of Classification Search
CPC ............. H03M 13/255; H03M 13/116; H03M 13/3761; H03M 13/6393; H03M 13/1185; H03M 13/036
See application file for complete search history.

(56) References Cited

U.S. PATENT DOCUMENTS

| | | | |
|---|---|---|---|
| 9,559,722 B1* | 1/2017 | Huang | H03M 13/6362 |
| 10,784,901 B2* | 9/2020 | Kudekar | H04L 1/0069 |
| 2017/0141798 A1* | 5/2017 | Kudekar | H04L 1/0041 |
| 2017/0331497 A1* | 11/2017 | Richardson | H03M 13/616 |
| 2019/0181883 A1* | 6/2019 | Ma | H03M 13/1148 |

OTHER PUBLICATIONS

International Search Report and Written Opinion—PCT/US2020/066787—ISA/EPO—dated Mar. 29, 2021.

* cited by examiner

*Primary Examiner* — Thien Nguyen
(74) *Attorney, Agent, or Firm* — Paradice and Li LLP /Qualcomm

(57) ABSTRACT

This disclosure provides systems, methods and apparatus, including computer programs encoded on computer storage media, for encoding data for wireless transmissions. In one aspect, a wireless device may encode a number (M) of systematic bits for transmission to a receiving device. The systematic bits may be encoded using a low-density parity-check (LDPC) code to produce an LDPC codeword. The LDPC codeword may include a number (N) of codeword bits, including the M systematic bits and one or more parity bits. The wireless device may further puncture a number (K) of the codeword bits to produce a punctured codeword having a code rate M/(N−K)>5/6. The wireless device may transmit the N−K remaining codeword bits, over a wireless channel, to a receiving device.

20 Claims, 17 Drawing Sheets

| | 1c | 2c | 3c | 4c | 5c | 6c | 7c | 8c | 9c | 10c | 11c | 12c | 13c | 14c | 15c | 16c | 17c | 18c | 19c | 20c | 21c | 22c | 23c | 24c | 25c | 26c |
|---|---|---|---|---|---|---|---|---|---|---|---|---|---|---|---|---|---|---|---|---|---|---|---|---|---|---|
| 1R | -1 | -1 | 841 | 173 | 1147 | 1018 | 18 | 17 | -1 | -1 | 590 | 902 | 1179 | 277 | 326 | -1 | 658 | 1277 | 301 | 573 | -1 | 0 | -1 | -1 | -1 | -1 |
| 2R | 582 | 903 | 331 | 947 | 81 | 1161 | 1096 | -1 | 836 | 567 | 7 | -1 | 129 | -1 | 1289 | 29 | 1137 | -1 | 231 | -1 | 699 | 0 | 0 | -1 | -1 | -1 |
| 3R | 1208 | 351 | -1 | 818 | 23 | -1 | 1101 | 681 | 111 | 691 | 1127 | 1215 | -1 | 424 | 947 | 1102 | -1 | 1055 | -1 | 324 | 163 | -1 | 0 | 0 | 0 | -1 |
| 4R | 86 | 515 | 496 | -1 | -1 | 1054 | -1 | 1224 | 445 | 599 | -1 | 769 | 332 | 72 | -1 | 589 | 855 | 382 | 754 | 214 | 738 | -1 | -1 | 0 | -1 | -1 |
| 5R | -1 | -1 | -1 | -1 | -1 | -1 | -1 | -1 | -1 | -1 | -1 | -1 | -1 | -1 | -1 | -1 | -1 | -1 | -1 | -1 | 180 | -1 | -1 | -1 | 392 | 0 |

RATE 7/8 LOW-DENSITY PARITY-CHECK (LDPC) CODE

CROSS-REFERENCE TO RELATED APPLICATIONS

This patent application claims priority to U.S. Provisional Patent Application No. 62/956,917 entitled "RATE 7/8 LOW-DENSITY PARITY-CHECK (LDPC) CODE" and filed on Jan. 3, 2020, which is assigned to the assignee hereof. The disclosures of all prior applications are considered part of and are incorporated by reference in this patent application.

TECHNICAL FIELD

This disclosure relates generally to wireless communications, and more specifically to low-density parity-check (LDPC) codes for wireless communications.

DESCRIPTION OF THE RELATED TECHNOLOGY

A wireless local area network (WLAN) may be formed by one or more access points (APs) that provide a shared wireless medium for use by a number of client devices or stations (STAs). Each AP, which may correspond to a Basic Service Set (BSS), may periodically broadcast beacon frames to enable any STAs within wireless range of the AP to establish and maintain a communication link with the WLAN. WLANs that operate in accordance with the IEEE 802.11 family of standards are commonly referred to as Wi-Fi networks. Imperfect channel conditions on the wireless communication medium may cause data loss during wireless data transmissions from a transmitting device to a receiving device. Some wireless communication systems use error-correcting codes to compensate for imperfect channel conditions. Error-correcting codes compensate for the intrinsic unreliability of information transfer in wireless communication systems by introducing redundancy into the data stream.

Low-density parity-check (LDPC) codes are a type of error-correcting code which use an iterative coding system. LDPC codes are linear codes that have sparse parity-check matrices. The sparseness of the parity-check matrices allows for relatively fast decoding and computationally inexpensive error correction. Some LDPC code designs use quasi-cyclic (QC) LDPC codes to yield more efficient hardware parallelization. For example, an LDPC decoder may be capable of processing multiple rows of a QC LDPC parity-check matrix in a single cycle. Wireless communication devices operating in accordance with existing versions of the IEEE 802.11 standard may generate LDPC codewords that are 1944 bits in length with a 5/6 code rate. In other words, the LDPC encoding process generates 324 parity bits for every 1620 bits of useful information (also referred to as "systematic bits"). Smaller codeword lengths (less than 1944 bits) are also available with existing versions of the IEEE 802.11 standard, however, coding gains are generally higher with longer codeword lengths. As wireless signaling capabilities continue to evolve, it may be desirable to increase the code rate or the codeword length of LDPC codewords to support wireless communications at significantly higher throughputs.

SUMMARY

The systems, methods and devices of this disclosure each have several innovative aspects, no single one of which is solely responsible for the desirable attributes disclosed herein.

One innovative aspect of the subject matter described in this disclosure can be implemented as a method of wireless communication. The method can be performed by a wireless communication device to encode data for transmission over a wireless channel. In some implementations, the method can include obtaining a number (M) of systematic bits; encoding the M systematic bits as a codeword based on a low-density parity-check (LDPC) code, where the codeword includes a number (N) of codeword bits; puncturing a number (K) of the codeword bits, where $M/(N-K)>5/6$; and transmitting the N−K codeword bits, over a wireless channel, to a receiving device. In some implementations, $M/(N-K)=7/8$. In some implementations, the method can further include modulating the N−K remaining codeword bits in accordance with a modulation scheme, where the number K of punctured codeword bits is based on a modulation order associated with the modulation scheme. In some implementations, the K punctured codeword bits can include one or more systematic bits, one or more parity bits, or a combination thereof.

In some implementations, $M/N=5/6$. In some aspects, $M=1620$, $N=1944$, and $K \geq 90$. In some other implementations, M can be a multiple of 1701, N can be a multiple of 2106, and K can be a multiple of 162. In some aspects, the LDPC code can be associated with a base matrix having 5 rows and 26 columns, where an intersection of each row and column of the base matrix represents a respective submatrix of dimension $Z \times Z$. In some implementations, the base matrix can include all-zero submatrices at the intersections of row 1 and each of columns 1, 2, 9, 10, 16, 21, 23, 24, and 26, at the intersections of row 2 and each of columns 8, 12, 14, 18, 20, 24, 25 and 26, the intersections of row 3 and each of columns 3, 6, 13, 17, 19, 22 and 26, at the intersections of row 4 and each of columns 4, 5, 7, 11, 15, 22, 23 and 26, and at the intersections of row 5 and each of columns 1-20 and 22-24. In some implementations, each of the remaining submatrices of the base matrix can include a cyclic permutation matrix.

Another innovative aspect of the subject matter described in this disclosure can be implemented in a wireless communication device. The wireless communication device can include one or more processors and a memory. The memory stores instructions that, when executed by the one or more processors, can cause the wireless communication device to obtain a number (M) of systematic bits; encode the M systematic bits as a codeword based on an LDPC code, where the codeword includes a number (N) of codeword bits; puncture a number (K) of the codeword bits, where $M/(N-K)>5/6$; and transmit the N−K remaining codeword bits, over a wireless channel, to a receiving device.

Another innovative aspect of the subject matter described in this disclosure can be implemented as a method of wireless communication. The method can be performed by a wireless communication device to decode data received over a wireless channel. In some implementations, the method can include receiving a number (L) of codeword bits, over a wireless channel, from a transmitting device; reconstructing a codeword based on the L received codeword bits and an LDPC code, where the codeword includes the L received codeword bits and one or more additional codeword bits; and recovering a number (M) of systematic bits based on the codeword, where $M/L>5/6$. In some implementations, $M/L=7/8$. In some implementations, the one or more additional codeword bits can include one or more systematic bits, one or more parity bits, or a combination thereof.

In some implementations, the LDPC code can be associated with a code rate equal to 5/6. In some other implementations, the LDPC code can be associated with a base matrix having 5 rows and 24 columns, where an intersection of each row and column of the base matrix represents a respective submatrix of dimension Z×Z. In some implementations, Z can be a multiple of 81. In some implementations, base matrix can include all-zero submatrices at the intersections of row 1 and each of columns 1, 2, 9, 10, 16, 21, 23, 24, and 26, at the intersections of row 2 and each of columns 8, 12, 14, 18, 20, 24, 25 and 26, the intersections of row 3 and each of columns 3, 6, 13, 17, 19, 22 and 26, at the intersections of row 4 and each of columns 4, 5, 7, 11, 15, 22, 23 and 26, and at the intersections of row 5 and each of columns 1-20 and 22-24. In some implementations, each of the remaining submatrices of the base matrix can include a cyclic permutation matrix.

Another innovative aspect of the subject matter described in this disclosure can be implemented in a wireless communication device. The wireless communication device can include one or more processors and a memory. The memory stores instructions that, when executed by the one or more processors, can cause the wireless communication device to receive a number (L) of codeword bits, over a wireless channel, from a transmitting device; reconstruct a codeword based on the L received codeword bits and an LDPC code, where the codeword includes the L received codeword bits and one or more additional codeword bits; and recover a number (M) of systematic bits based on the codeword, where M/L>5/6.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

FIG. 5 shows an example parity-check matrix for a low-density parity-check (LDPC) code.

FIGS. 6A-6C show example cyclic permutation matrices.

FIG. 8 shows another example parity-check matrix for an LDPC code.

Like reference numbers and designations in the various drawings indicate like elements.

DETAILED DESCRIPTION

Figure 1:
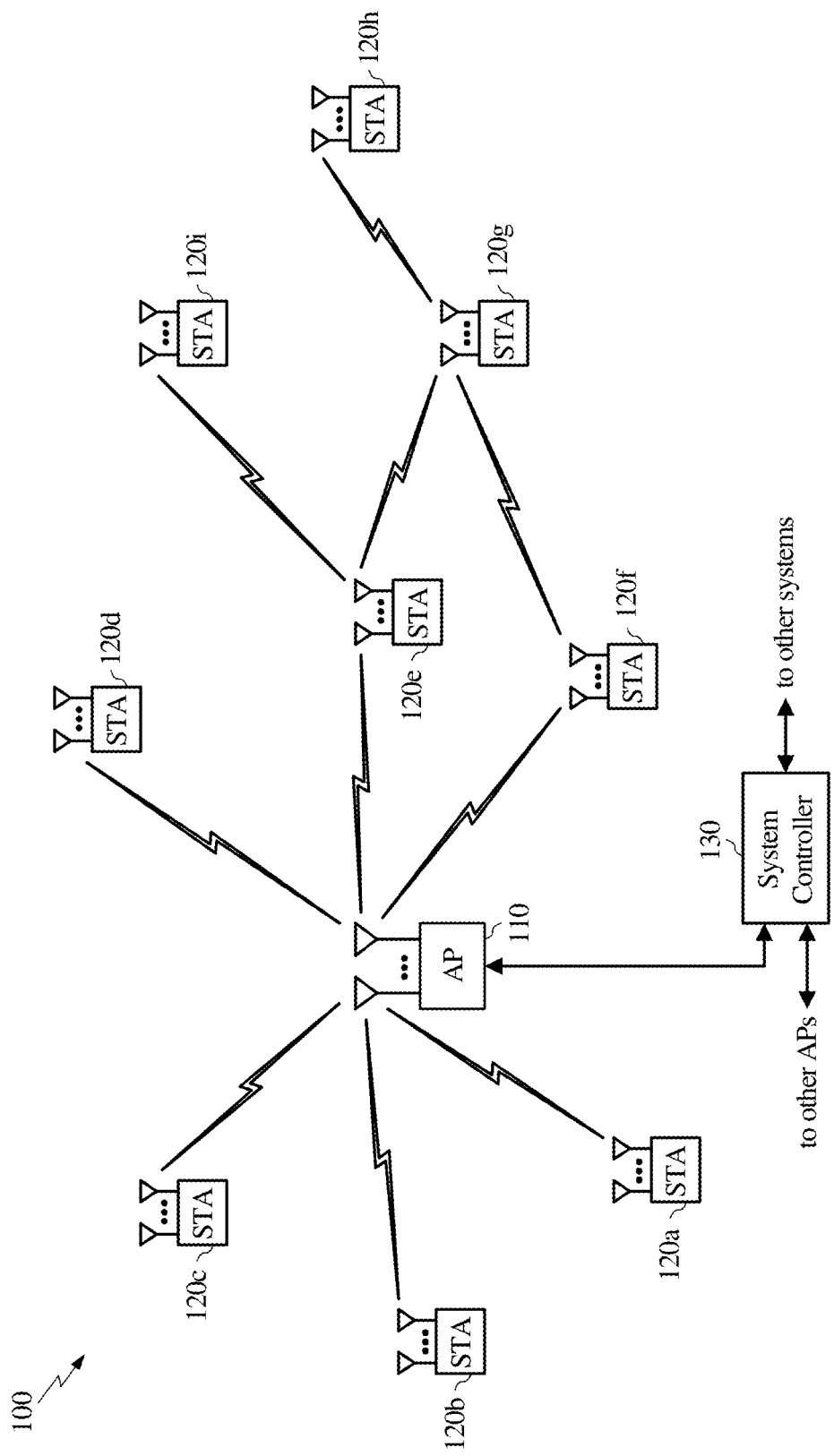
FIG. 1 shows a block diagram of an example wireless system.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, system or network that is capable of transmitting and receiving RF signals according to any of the IEEE 16.11 standards, or any of the IEEE 802.11 standards, the Bluetooth® standard, code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or internet of things (IOT) network, such as a system utilizing 3G, 4G or 5G, or further implementations thereof, technology.

Implementations of the subject matter described in this disclosure may be used for increasing the code rate of low-density parity-check (LDPC) codewords. In some implementations, a higher code rate may be achieved by puncturing one or more bits of an LDPC codeword generated using legacy LDPC codes (such as defined by existing IEEE 802.11 standards). For example, a rate 7/8 codeword may be derived by puncturing 93 bits of a rate 5/6 codeword of length 1944. Another example is to puncture 96 bits of a rate 5/6 codeword of length 1944 to result in a new code of rate close to 7/8. Puncturing 96 bits may be more convenient to implement in cases where the number of punctured bits must be a multiple of bits in a modulation symbol (assuming a 4096-QAM, where each QAM symbol carries 12 bits). Puncturing 90 bits is also possible for the 4096-QAM, for example, resulting in 7.5 QAM punctured symbols. Effectively, fifteen 4096-QAM symbols are punctured for every two codewords. The punctured bits may include systematic bits, parity bits, or any combination thereof. In some other implementations, the systematic bits may be encoded using a new LDPC code that is optimized for the higher code rate (such as rate 7/8). For example, the new LDPC code may be optimized for encoding a greater number of parity bits for a given codeword length (compared to legacy LDPC codes). In some aspects, the number of parity bits generated using the new LDPC code may cause the resulting codeword to exceed the desired codeword length. Thus, one or more bits of the resulting codeword (including systematic bits, parity bits or combination thereof) may be punctured to achieve the desired code rate.

Particular implementations of the subject matter described in this disclosure can be implemented to realize one or more of the following potential advantages. As the throughput of wireless communications continues to expand, higher code rates (≥7/8) may be needed to support the higher throughput communications. By puncturing one or more bits of LDPC codewords generated using legacy LDPC codes, aspects of the present disclosure may increase the code rate of the LDPC codewords (such as from 5/6 to 7/8) with little or no modification to existing encoding or decoding hardware. On the other hand, by implementing new LDPC codes that are optimized for higher code rates, aspects of the present disclosure may produce LDPC codewords that provide more robust communications at the higher code rates. The new high rate LDPC codes may result in improved coding gains compared to punctured legacy LDPC code (such as by puncturing a rate 5/6 code to obtain a rate 7/8 code). In some aspects, the new high rate LDPC codes may provide the flexibility of puncturing parity bits or systematic bits or both parity and information bits to suit certain applications without compromising coding gains. In some other aspects, the new high rate LDPC codes may achieve a higher rate code by further puncturing (parity bits, systematic bits, or a combination thereof) without substantial loss in coding gain. As such, multiple high rate LDPC codes can be derived from a single high rate LDPC code, hence simplifying hardware or software implementations. Still further, in some aspects, the new high rate LDPC codes may support larger codeword lengths (>1944 bits per codeword), resulting in even greater coding gains. Because shorter length codes can be derived from the larger length codes based on a modulo operation, larger LDPC codes can be implemented without significant increasing storage or memory requirements.

FIG. 1 shows a block diagram of an example wireless system 100. The wireless system 100 is shown to include a wireless access point (AP) 110 and a number of wireless stations (STAs) 120a-120i. For simplicity, one AP 110 is shown in FIG. 1. The AP 110 may form a wireless local area network (WLAN) that allows the AP 110, the STAs 120a-120i, and other wireless devices (not shown for simplicity) to communicate with each other over a wireless medium. The wireless medium, which may be divided into a number of channels or into a number of resource units (RUs), may facilitate wireless communications between the AP 110, the STAs 120a-120i, and other wireless devices connected to the WLAN. In some implementations, the STAs 120a-120i can communicate with each other using peer-to-peer communications (such as without the presence or involvement of the AP 110). The AP 110 may be assigned a unique MAC address that is programmed therein by, for example, the manufacturer of the access point. Similarly, each of the STAs 120a-120i also may be assigned a unique MAC address.

In some implementations, the wireless system 100 may correspond to a multiple-input multiple-output (MIMO) wireless network and may support single-user MIMO (SU-MIMO) and multi-user (MU-MIMO) communications. In some implementations, the wireless system 100 may support orthogonal frequency-division multiple access (OFDMA) communications. Further, although the WLAN is depicted in FIG. 1 as an infrastructure Basic Service Set (BSS), in some other implementations, the WLAN may be an Independent Basic Service Set (IBSS), an Extended Service Set (ESS), an ad-hoc network, or a peer-to-peer (P2P) network (such as operating according to one or more Wi-Fi Direct protocols).

The STAs 120a-120i may be any suitable Wi-Fi enabled wireless devices including, for example, cell phones, personal digital assistants (PDAs), tablet devices, laptop computers, or the like. The STAs 120a-120i also may be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

The AP 110 may be any suitable device that allows one or more wireless devices (such as the STAs 120a-120i) to connect to another network (such as a local area network (LAN), wide area network (WAN), metropolitan area network (MAN), or the Internet). In some implementations, a system controller 130 may facilitate communications between the AP 110 and other networks or systems. In some implementations, the system controller 130 may facilitate communications between the AP 110 and one or more other APs (not shown for simplicity) that may be associated with other wireless networks. In addition, or in the alternative, the AP 110 may exchange signals and information with one or more other APs using wireless communications.

The AP 110 may periodically broadcast beacon frames to enable the STAs 120a-120i and other wireless devices within wireless range of the AP 110 to establish and maintain a communication link with the AP 110. The bacon frames, which may indicate downlink (DL) data transmissions to the STAs 120a-120i and solicit or schedule uplink (UL) data transmissions from the STAs 120a-120i, are typically broadcast according to a target beacon transmission time (TBTT) schedule. The broadcasted beacon frames may include a timing synchronization function (TSF) value of the AP 110. The STAs 120a-120i may synchronize their own local TSF values with the broadcasted TSF value, for example, so that all of the STAs 120a-120i are synchronized with each other and with the AP 110.

In some implementations, each of the stations STAs 120a-120i and the AP 110 may include one or more transceivers, one or more processing resources (such as processors or Application-Specific Integrated Circuits (ASICs)), one or more memory resources, and a power source (such as a battery). The one or more transceivers may include Wi-Fi transceivers, Bluetooth transceivers, cellular transceivers, or other suitable radio frequency (RF) transceivers (not shown for simplicity) to transmit and receive wireless communication signals. In some implementations, each transceiver may communicate with other wireless devices in distinct frequency bands or using distinct communication protocols. The memory resources may include a non-transitory computer-readable medium (such as one or more nonvolatile memory elements, such as EPROM, EEPROM, Flash memory, a hard drive, etc.) that stores instructions for performing one or more operations described with respect to FIGS. 5-11.

Figure 2:
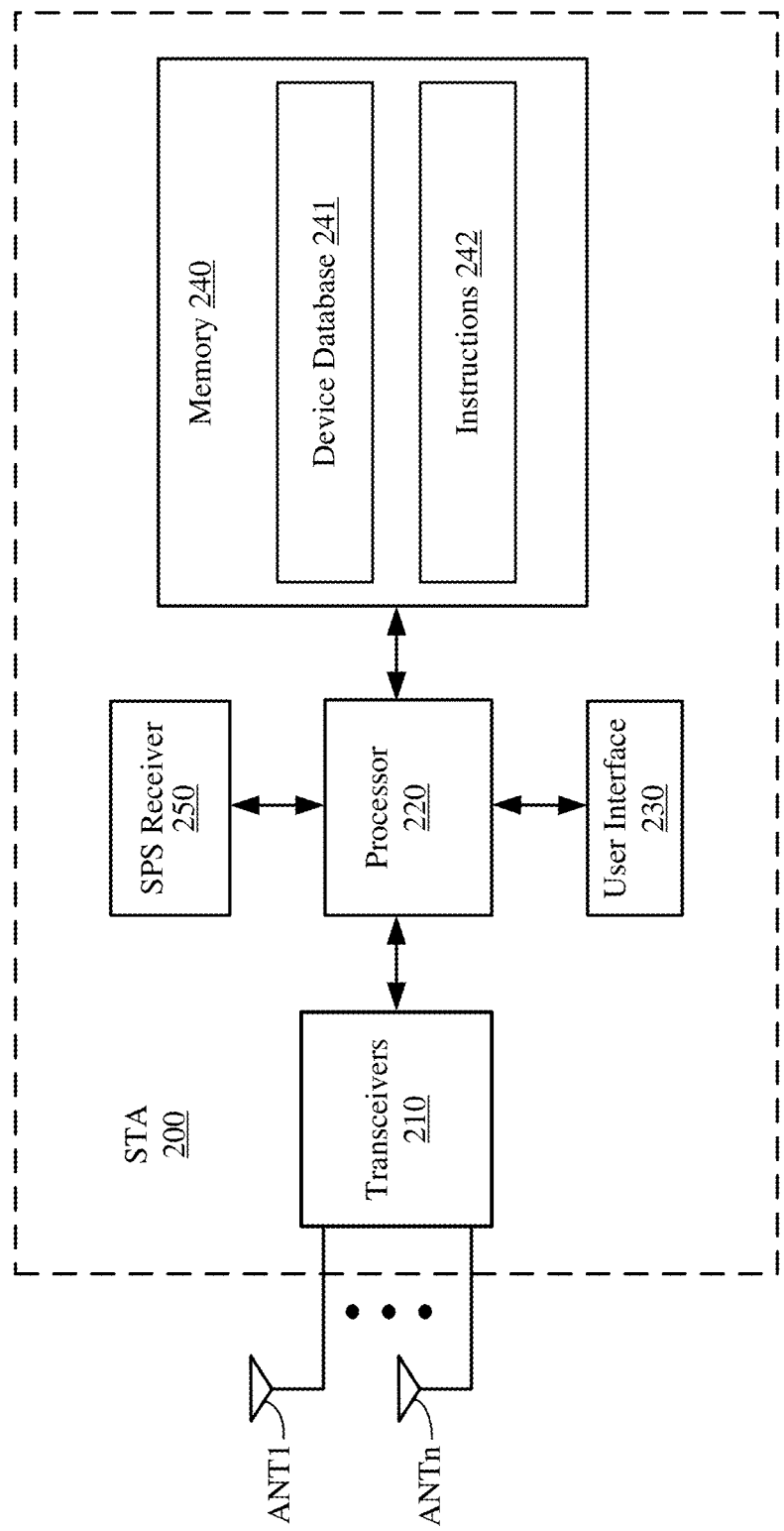
FIG. 2 shows a block diagram of an example wireless station (STA).

FIG. 2 shows an example wireless station (STA) 200. The STA 200 may be one implementation of at least one of the STAs 120a-120i of FIG. 1. The STA 200 may include one or more transceivers 210, a processor 220, a user interface 230, a memory 240, and a number of antennas ANT1-ANTn. The transceivers 210 may be coupled to antennas ANT1-ANTn, either directly or through an antenna selection circuit (not shown for simplicity). The transceivers 210 may be used to transmit signals to and receive signals from other wireless devices including, for example, a number of APs and a number of other STAs. Although not shown in FIG. 2 for simplicity, the transceivers 210 may include any number of transmit chains to process and transmit signals to other wireless devices via antennas ANT1-ANTn, and may include any number of receive chains to process signals received from antennas ANT1-ANTn. Thus, the STA 200 may be configured for MIMO communications and OFDMA communications. The MIMO communications may include SU-MIMO communications and MU-MIMO communications. In some implementations, the STA 200 may use multiple antennas ANT1-ANTn to provide antenna diversity. Antenna diversity may include polarization diversity, pattern diversity, and spatial diversity.

The processor 220 may be any suitable one or more processors capable of executing scripts or instructions of one or more software programs stored in the STA 200 (such as within the memory 240). In some implementations, the processor 220 may be or include one or more microprocessors providing the processor functionality and external memory providing at least a portion of machine-readable media. In other implementations, the processor 220 may be or include an Application Specific Integrated Circuit (ASIC) with the processor, the bus interface, the user interface, and at least a portion of the machine-readable media integrated into a single chip. In some other implementations, the processor 220 may be or include one or more Field Programmable Gate Arrays (FPGAs) or Programmable Logic Devices (PLDs).

The user interface 230, which is coupled to the processor 220, may be or represent a number of suitable user input devices such as, for example, a speaker, a microphone, a display device, a keyboard, a touch screen, and so on. In some implementations, the user interface 230 may allow a user to control a number of operations of the STA 200, to interact with one or more applications executable by the STA 200, and other suitable functions.

In some implementations, the STA 200 may include a satellite positioning system (SPS) receiver 250. The SPS receiver 250, which is coupled to the processor 220, may be used to acquire and receive signals transmitted from one or more satellites or satellite systems via an antenna (not shown for simplicity). Signals received by the SPS receiver 250 may be used to determine (or at least assist with the determination of) a location of the STA 200.

The memory 240 may include a device database 241 that may store location data, configuration information, data rates, a medium access control (MAC) address, timing information, modulation and coding schemes (MCSs), traffic indication (TID) queue sizes, ranging capabilities, and other suitable information about (or pertaining to) the STA 200. The device database 241 also may store profile information for a number of other wireless devices. The profile information for a given wireless device may include, for example, a service set identification (SSID) for the wireless device, a Basic Service Set Identifier (BSSID), operating channels, TSF values, beacon intervals, ranging schedules, channel state information (CSI), received signal strength indicator (RSSI) values, goodput values, and connection history with the STA 200. In some implementations, the profile information for a given wireless device also may include clock offset values, carrier frequency offset values, and ranging capabilities.

The memory 240 also may be or include a non-transitory computer-readable storage medium (such as one or more nonvolatile memory elements, such as EPROM, EEPROM, Flash memory, a hard drive, and so on) that may store computer-executable instructions 242 to perform all or a portion of one or more operations described in this disclosure.

Figure 3:
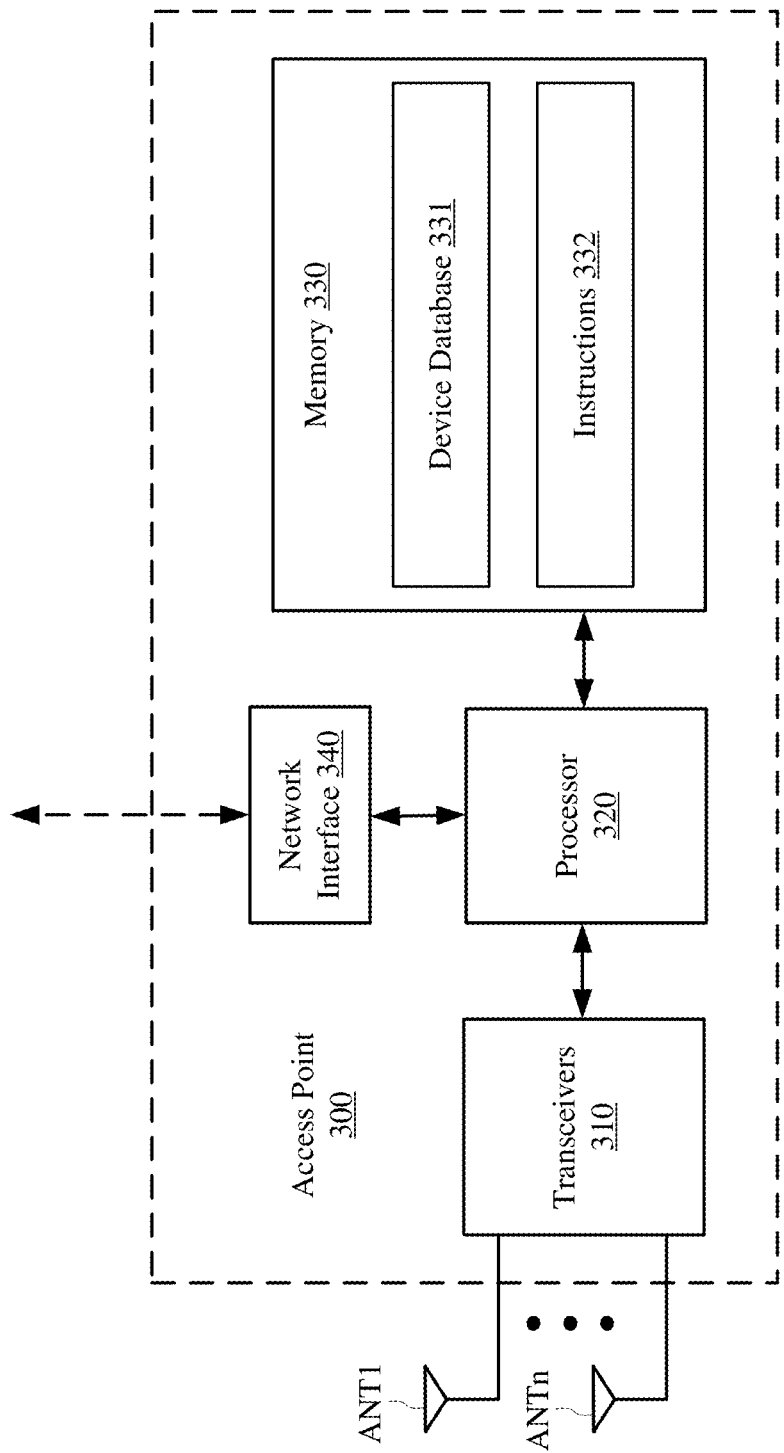
FIG. 3 shows a block diagram of an example access point (AP).

FIG. 3 shows an example access point (AP) 300. The AP 300 may be one implementation of the AP 110 of FIG. 1. The AP 300 may include one or more transceivers 310, a processor 320, a memory 330, a network interface 340, and a number of antennas ANT1-ANTn. The transceivers 310 may be coupled to the antennas ANT1-ANTn, either directly or through an antenna selection circuit (not shown for simplicity). The transceivers 310 may be used to transmit signals to and receive signals from other wireless devices including, for example, one or more of the STAs 120a-120i of FIG. 1 and other APs. Although not shown in FIG. 3 for simplicity, the transceivers 310 may include any number of transmit chains to process and transmit signals to other wireless devices via the antennas ANT1-ANTn, and may include any number of receive chains to process signals received from the antennas ANT1-ANTn. Thus, the AP 300 may be configured for MIMO communications and OFDMA communications. The MIMO communications may include SU-MIMO communications and MU-MIMO communications. In some implementations, the AP 300 may use multiple antennas ANT1-ANTn to provide antenna diversity. Antenna diversity may include polarization diversity, pattern diversity, and spatial diversity.

The network interface 340, which is coupled to the processor 320, may be used to communicate with the system controller 130 of FIG. 1. The network interface 340 also may allow the AP 300 to communicate, either directly or via one or more intervening networks, with other wireless systems, with other APs, with one or more back-haul networks, or any combination thereof.

The memory 330 may include a device database 331 that may store location data, configuration information, data rates, the MAC address, timing information, MCSs, ranging capabilities, and other suitable information about (or pertaining to) the AP 300. The device database 331 also may store profile information for a number of other wireless devices (such as one or more of the stations 120a-120i of FIG. 1). The profile information for a given wireless device may include, for example, an SSID for the wireless device, a BSSID, operating channels, CSI, received signal strength indicator (RSSI) values, goodput values, and connection history with the AP 300. In some implementations, the profile information for a given wireless device also may include TID queue sizes, a preferred packet duration for trigger-based UL transmissions, and a maximum amount of queued UL data that the wireless device is able to insert into TB PPBUs.

The memory 330 also may be or include a non-transitory computer-readable storage medium (such as one or more nonvolatile memory elements, such as EPROM, EEPROM, Flash memory, a hard drive, and so on) that may store computer-executable instructions 332 to perform all or a portion of one or more operations described in this disclosure.

Figure 4:
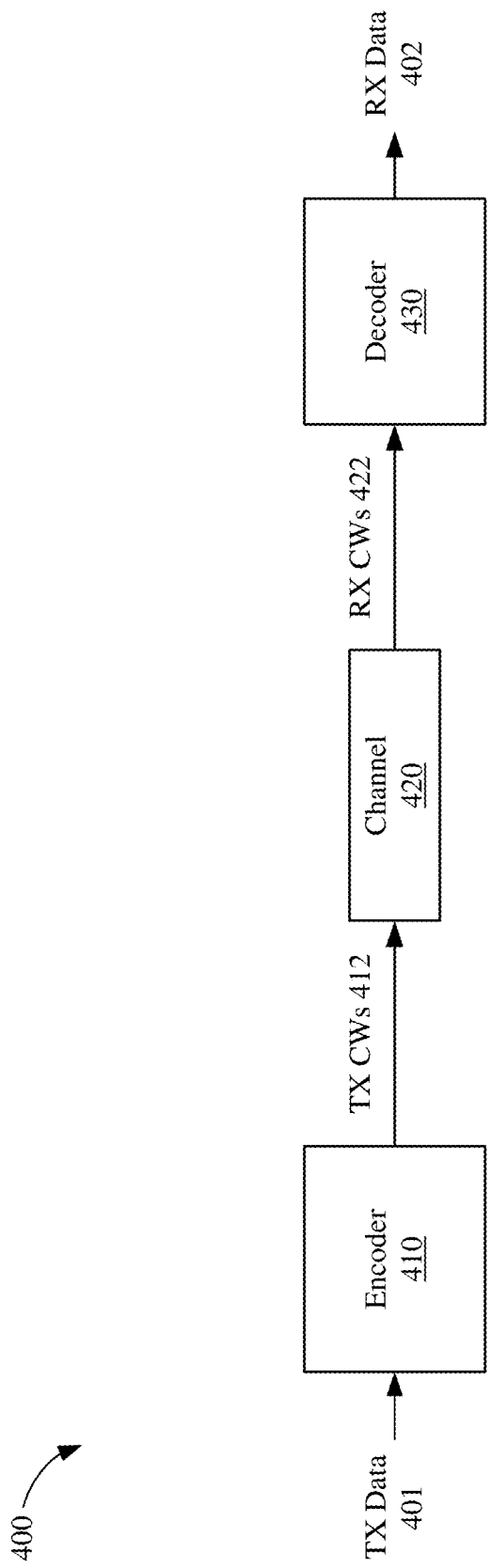
FIG. 4 shows a block diagram of an example communication system.

FIG. 4 shows a block diagram of an example communication system 400. The communication system 400 includes an encoder 410, a channel 420, and a decoder 430. The encoder 410 may be included in, or correspond to, a transmitting device. In some implementations, the transmitting device may be one example of the AP 110 of FIG. 1 or the AP 300 of FIG. 3. In some other implementations, the transmitting device may be one example of any of the STAs 120a-120i of FIG. 1 or the STA 200 of FIG. 2. The decoder 420 may be included in, or correspond to, a receiving device. In some implementations, the receiving device may be one example of the AP 110 of FIG. 1 or the AP 300 of FIG. 3. In some other implementations, the receiving device may be one example of any of the STAs 120a-120i of FIG. 1 or the STA 200 of FIG. 2.

The channel 420 may include any communication link between the encoder 410 and the decoder 430. In some implementations, the channel 420 may be a wireless communication medium. In some other implementations, the channel may include one or more wired connections or physical media. Imperfections in the channel 420 may introduce channel distortion (such as linear distortion, multipath effects, Additive White Gaussian Noise (AWGN), and the like). To compensate for channel imperfections, the encoder 410 may encode (TX) data 401 to be transmitted over the channel 420 so that error correction may be performed by the decoder 430 to recover the (RX) data 402. In some implementations, the encoder 410 may use a low-density parity-check (LDPC) code to encode the TX data 401 into one or more TX codewords (CWs) 412. The decoder 430 may use the same LDPC code to decode one or more RX codewords 422, received via the channel 420, and recover the RX data 402. If the channel 420 introduces errors (such as flipped bits) into the TX codewords 412, the decoder 430 may detect and correct such errors in the RX codewords 422 using a parity-check matrix associated with the LDPC code.

As described above, wireless communication devices operating in accordance with existing IEEE 802.11 standards may generate LDPC codewords that are 1944 bits in length with a 5/6 code rate. In other words, the LDPC encoding process produces 6 codeword bits (or 1 parity bit) for every 5 bits of useful data (also referred to as "systematic bits"). However, as the throughput of wireless communications continues to expand, higher code rates may be needed to support the higher throughput communications. In some implementations, the encoder 410 may achieve a higher code rate by puncturing one or more bits of an LDPC codeword generated using legacy LDPC codes. For example, the encoder 410 may produce a rate ≥7/8 codeword by puncturing at least 93 bits of a rate 5/6 codeword of length 1944. In other words, of the 1944 total codeword bits, only 1851 bits may be transmitted (as TX codewords 412) over the channel 420. The punctured bits may include systematic bits, parity bits, or any combination thereof. The punctured bits may be treated as erasures and thereby corrected or recovered by the decoder 430. As a result, the decoder 430 may recover 1620 bits of RX data 402 from 1851 bits of each TX codeword 412 (using a rate 5/6 LDPC code), resulting in an effective code rate of 7/8. Another example is to puncture 96 of the 1944 codeword bits of the legacy IEEE 802.11 rate 5/6 LDPC code, resulting in a new codeword of length 1848 bits. The resulting code has rate 1620/1848=0.8766, which is close to a rate 7/8 code. As described above, the actual number of punctured bits (such as 93 or 96 bits) can be a function of modulation order so that the number of punctured bits is a multiple of half the number of bits carried by a QAM symbol.

In some other implementations, the encoder 410 may encode the TX data 401 using a new LDPC code that is optimized for higher code rates. For example, the new LDPC code may be optimized for encoding a greater number of parity bits for a given codeword length (compared to legacy LDPC codes). In some implementations, the new LDPC code may be based on a quasi-cyclic (QC) parity-check matrix. Such codes may be referred to as QC LDPC codes. A parity-check matrix for a QC LDPC code may be represented by a base matrix and expansion submatrices for expanding the elements of the base matrix. Each submatrix of a parity-check matrix may correspond to an all-zero matrix or a cyclic permutation matrix (also referred to as a "circulant matrix") having a circulant weight greater than or equal to 1. For a cyclic permutation matrix with a circulant weight of 1, each row and column of the cyclic permutation matrix may contain only one non-zero element. As a result, multiple rows of the cyclic permutation matrix may be processed in parallel (or simultaneously) by the decoder 430.

Figure 5:
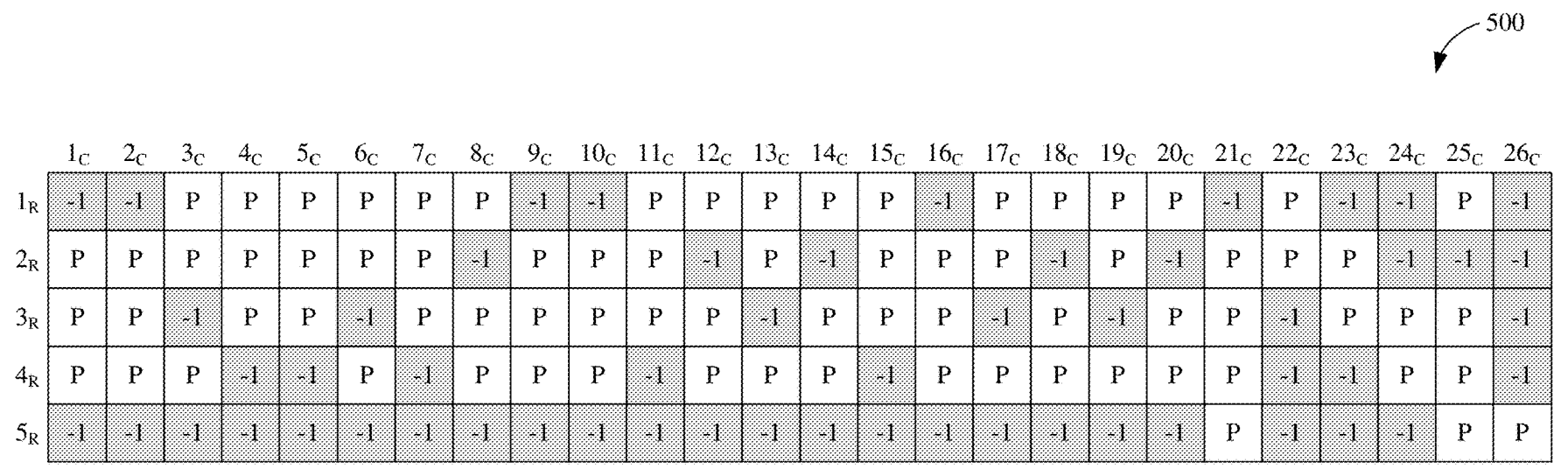

FIG. 5 shows an example parity-check matrix 500 for a low-density parity-check (LDPC) code. In some implementations, the parity-check matrix 500 may be optimized for rate 7/8 LDPC codewords. With reference for example to FIG. 4, the parity-check matrix 500 (or a generator matrix based on the parity-check matrix 500) may be used by the encoder 410 to encode the TX data 401 into TX codewords 412. More specifically, the encoder 410 may use the parity-check matrix 500 to generate a number (L) of parity bits for a number (M) of systematic bits of the TX data 401. The parity bits are added to the systematic bits to produce a number (N) of codeword bits representing a TX codeword 412. The decoder 430 may use the parity-check matrix 500 to validate and correct individual bits of the RX codeword 422. More specifically, the decoder 430 may determine that the RX codeword 422 is a valid codeword if the following condition is satisfied: $Hc^T=0$, where H represents the parity-check matrix 500 and c is a vector representing the RX codeword 422.

In some implementations, the parity-check matrix 500 may correspond to a base matrix of a QC LDPC code. As shown in FIG. 5, the base matrix includes 5 rows (denoted with a subscript "R") and 26 columns (denoted with a subscript "C"). At the intersection of each row and column of the parity-check matrix 500 resides a submatrix of dimension Z×Z. For example, each "−1" entry in the parity-check matrix 500 may be expanded to an all-zero submatrix and each "P" in the parity-check matrix 500 may be expanded to a cyclic permutation matrix having a circulant weight equal to or greater than 1. As shown in FIG. 5, an all-zero submatrix resides at the intersection of row 1 and each of columns 1, 2, 9, 10, 16, 21, 23, 24 and 26, at the intersection of row 2 and each of columns 8, 12, 14, 18, 20, 24, 25 and 26, at the intersection of row 3 and each of columns 3, 6, 13, 17, 19, 22 and 26, at the intersection of row 4 and each of columns 4, 5, 7, 11, 15, 22, 23 and 26, and at the intersection of row 5 and each of columns 1-20 and 22-24 of the parity-check matrix 500.

Figures 6A, 6B, 6C:
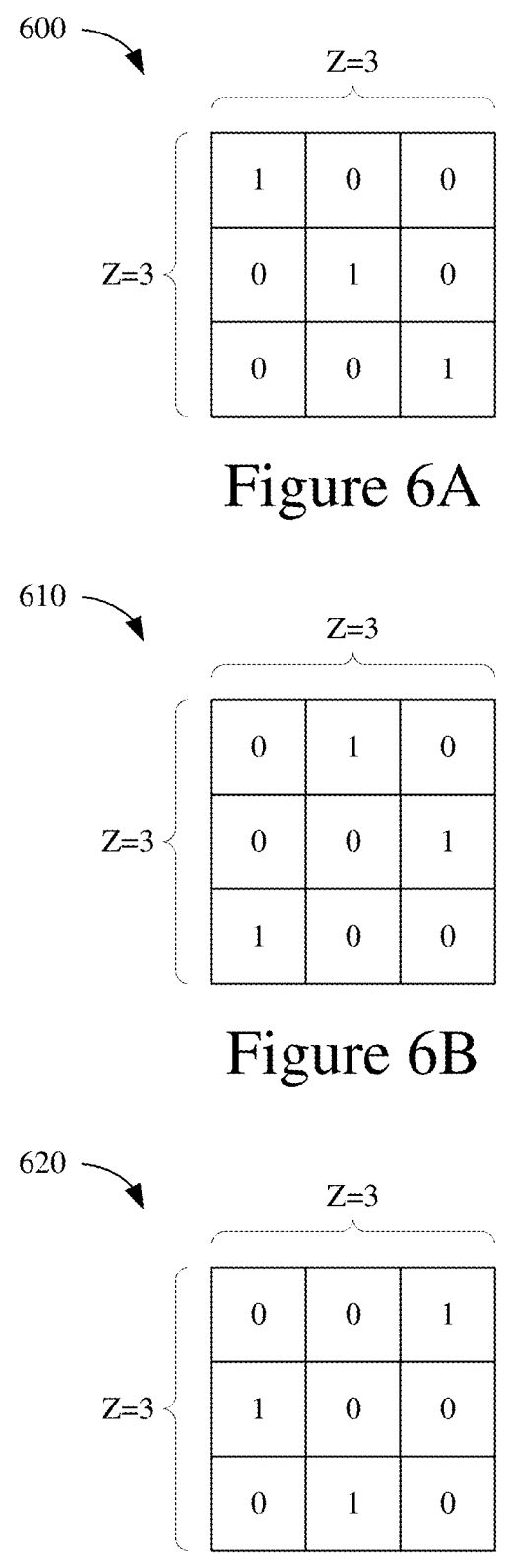

In some implementations, each cyclic permutation matrix P of the parity-check matrix 500 may have circulant weight equal to 1. FIG. 6A shows a 3×3 cyclic permutation matrix 600 having a circulant weight equal to 1 and a rotation of size 0. It is noted that the cyclic permutation matrix 600 is a 3×3 identity matrix. FIG. 6B shows a 3×3 cyclic permutation matrix 610 having a circulant weight equal to 1 and a rotation of size 1. With reference for example to FIG. 6A, the cyclic permutation matrix 610 may be generated by shifting or "rotating" each column of the cyclic permutation matrix 600 to the right by one column. FIG. 6C shows a 3×3 cyclic permutation matrix 620 having a circulant weight equal to 1 and a rotation of size 2. With reference for example to FIG. 6A, the cyclic permutation matrix 620 may be generated by shifting or rotating each column of the cyclic permutation matrix 600 to the right by two columns.

Figure 7:
FIG. 7 shows another example parity-check matrix for an LDPC code.

FIG. 7 shows another example parity-check matrix 700 for an LDPC code. In some implementations, the parity-check matrix 700 may be optimized for rate 7/8 LDPC codewords. For example, the parity-check matrix 700 may be one example of the parity-check matrix 500 of FIG. 5. Thus, the parity-check matrix 700 may correspond to a base matrix of a QC LDPC code. In some implementations, each entry in the parity-check matrix 700 may correspond to a submatrix of dimension 81×81 (Z=81), where each "−1" entry represents an all-zero submatrix and each entry with a positive integer value (n) represents a cyclic permutation matrix having a circulant weight equal to 1 and a rotation of size n. As described with respect to FIGS. 6A-6C, an entry with value 0 represents an identity matrix of dimension 81×81. With reference for example to FIG. 5, each "P" entry in the parity-check matrix 500 may be substituted for an 81×81 cyclic permutation matrix P(n) to produce the parity-check matrix 700 of FIG. 7.

As shown in FIG. 7, the intersection of row 1 and each of columns 3-8, 11-15, 17-20, 22 and 25 of the parity-check matrix 700 includes a cyclic permutation matrix having a rotation of size 31, 11, 13, 46, 18, 17, 23, 11, 45, 34, 2, 10, 62, 58, 6, 0 and 1, respectively; the intersection of row 2 and each of columns 1-7, 9-11, 13, 15-17, 19, and 21-23 of the parity-check matrix 700 includes a cyclic permutation matrix having a rotation of size 15, 12, 7, 56, 0, 27, 43, 26, 0, 7, 48, 74, 29, 3, 69, 51, 0, and 0, respectively; the intersection of row 3 and each of columns 1, 2, 4, 5, 7-12, 14-16, 18, 20, 21, 23, 24 and 25 of the parity-check matrix 700 includes a cyclic permutation matrix having a rotation of size 74, 27, 8, 23, 48, 33, 30, 43, 74, 0, 19, 56, 49, 2, 0, 1, 0, 0 and 0, respectively; the intersection of row 4 and each of columns 1-3, 6, 8-10, 12-14, 16-21, 24 and 25 of the parity-check matrix 700 includes a cyclic permutation matrix having a rotation of size 5, 29, 10, 1, 9, 40, 32, 40, 8, 72, 22, 45, 58, 25, 52, 9, 0 and 1, respectively; and the intersection of row 5 and each of columns 21, 25 and 26 of the parity-check matrix 700 includes a cyclic permutation matrix having a rotation of size 18, 68 and 0, respectively.

In some implementations, an LDPC encoder (such as the encoder 410 of FIG. 4) may use the parity-check matrix 700, or a generator matrix associated with the parity-check matrix 700, to encode 1701 systematic bits into codewords of length 1944, for example, to achieve a 7/8 code rate. The encoding process may generate 405 parity bits for every 1701 systematic bits, resulting in 2106 total codeword bits. In some implementations, the LDPC encoder may puncture 162 codeword bits of the 2106-bit codeword so that only the remaining 1944 codeword bits (representing a punctured codeword) are transmitted over a communications channel (such as the channel 420 of FIG. 4). In some aspects, the punctured bits may include the last 81 systematic bits of the LDPC codeword (corresponding to column 21 of the parity-check matrix 700, shown with shading in FIG. 7) and 81 parity bits from index 244 to index 324 (corresponding to column 25 of the parity-check matrix 700, shown with shading in FIG. 7), assuming the 405 parity bits have a starting index of 1. In some other aspects, the punctured bits may include any number of systematic bits, parity bits, or combination thereof.

FIG. 8 shows another example parity-check matrix 800 for an LDPC code. In some implementations, the parity-check matrix 800 may be optimized for rate 7/8 LDPC codewords. For example, the parity-check matrix 800 may be one example of the parity-check matrix 500 of FIG. 5. Thus, the parity-check matrix 800 may correspond to a base matrix of a QC LDPC code. In some implementations, each entry in the parity-check matrix 800 may correspond to a submatrix of dimension 1296×1296 (Z=1296), where each "−1" entry represents an all-zero submatrix and each entry with a positive integer value (n) represents a cyclic permutation matrix having a circulant weight equal to 1 and a rotation of size n. With reference for example to FIG. 5, each "P" entry in the parity-check matrix 500 may be substituted for a 1296×1296 cyclic permutation matrix P(n) to produce the parity-check matrix 800 of FIG. 8.

As shown in FIG. 8, the intersection of row 1 and each of columns 3-8, 11-15, 17-20, 22 and 25 of the parity-check matrix 800 includes a cyclic permutation matrix having a rotation of size 841, 173, 1147, 1018, 18, 17, 590, 902, 1179, 277, 326, 658, 1277, 301, 573, 0 and 1, respectively; the intersection of row 2 and each of columns 1-7, 9-11, 13, 15-17, 19, and 21-23 of the parity-check matrix 800 includes a cyclic permutation matrix having a rotation of size 582, 903, 331, 947, 81, 1161, 1096, 836, 567, 7, 129, 1289, 29, 1137, 231, 699, 0, and 0, respectively; the intersection of row 3 and each of columns 1, 2, 4, 5, 7-12, 14-16, 18, 20, 21, 23-25 of the parity-check matrix 800 includes a cyclic permutation matrix having a rotation of size 1208, 351, 818, 23, 1101, 681, 111, 691, 1127, 1215, 424, 947, 1102, 1055, 324, 163, 0, 0 and 0, respectively; the intersection of row 4 and each of columns 1-3, 6, 8-10, 12-14, 16-21, 24 and 25 of the parity-check matrix 800 includes a cyclic permutation matrix having a rotation of size 86, 515, 496, 1054, 1224, 445, 599, 769, 332, 72, 589, 855, 382, 754, 214, 738, 0 and 1, respectively; the intersection of row 5 and each of columns 21, 25 and 26 of the parity-check matrix 800 includes a cyclic permutation matrix having a rotation of size 180, 392 and 0, respectively.

In some implementations, an LDPC encoder (such as the encoder 410 of FIG. 4) may use the parity-check matrix 800, or a generator matrix associated with the parity-check matrix 800, to encode 27216 systematic bits into codewords of length 31104, for example, to achieve a 7/8 code rate. The encoding process may generate 6480 parity bits for every 27216 systematic bits, resulting in 33696 total codeword bits. In some implementations, the LDPC encoder may puncture 2592 codeword bits of the 33696-bit codeword so that only the remaining 31104 codeword bits (representing a punctured codeword) are transmitted over a communications channel (such as the channel 420 of FIG. 4). In some aspects, the punctured bits may include the last 1296 systematic bits of the LDPC codeword (corresponding to column 21 of the parity-check matrix 800, shown with shading in FIG. 8) and 1296 parity bits from index 3889 to index 5184 (corresponding to column 25 of the parity-check matrix 800, shown with shading in FIG. 8), assuming the 6480 parity bits have a starting index of 1. In some other aspects, the punctured bits may include any number of systematic bits, parity bits, or combination thereof.

It can be seen that the base matrix (of dimension 5×26) for the submatrix of Z=1296 can be used to produce other base matrices with different lifting factors (such as for Z=81, 162, 324, and 648) by taking the lifting entries modulo x*81 for x=1, 2, 4, 8. With reference for example to FIG. 8, the entry at row 5, column 25, of the parity-check matrix 800 has a value 392. Taking 392 modulo 81 yields a value 68, which is the value in row 5, column 25 of the parity-check matrix 700 of FIG. 7.

Figure 9:
FIG. 9 shows another example parity-check matrix for an LDPC code.

FIG. 9 shows another example parity-check matrix 900 for an LDPC code. In some implementations, the parity-check matrix 900 may be derived from the base matrix of FIG. 8, where Z=162, M=3402, N=4212, and K=324. Thus, the parity-check matrix 900 may be one example of the parity-check matrix 500 of FIG. 5. In some implementations, each entry in the parity-check matrix 900 may correspond to a submatrix of dimension 162×162, where each "−1" entry represents an all-zero submatrix and each entry with a positive integer value (n) represents a cyclic permutation matrix having a circulant weight equal to 1 and a rotation of size n. With reference for example to FIG. 5, each "P" entry in the parity-check matrix 500 may be substituted for a 162×162 cyclic permutation matrix P(n) to produce the parity-check matrix 900 of FIG. 9.

As shown in FIG. 9, the intersection of row 1 and each of columns 3-8, 11-15, 17-20, 22 and 25 of the parity-check matrix 900 includes a cyclic permutation matrix having a rotation of size 31, 11, 13, 46, 18, 17, 104, 92, 45, 115, 2, 10, 143, 139, 87, 0 and 1, respectively; the intersection of row 2 and each of columns 1-7, 9-11, 13, 15-17, 19, and 21-23 of the parity-check matrix 900 includes a cyclic permutation matrix having a rotation of size 96, 93, 7, 137, 81, 27, 124, 26, 81, 7, 129, 155, 29, 3, 69, 51, 0, and 0, respectively; the intersection of row 3 and each of columns 1, 2, 4, 5, 7-12, 14-16, 18, 20, 21, 23-25 of the parity-check matrix 900 includes a cyclic permutation matrix having a rotation of size 74, 27, 8, 23, 129, 33, 111, 43, 155, 81, 100, 137, 130, 83, 0, 1, 0, 0 and 0, respectively; the intersection of row 4 and each of columns 1-3, 6, 8-10, 12-14, 16-21, 24 and 25 of the parity-check matrix 900 includes a cyclic permutation matrix having a rotation of size 86, 29, 10, 82, 90, 121, 113, 121, 8, 72, 103, 45, 58, 106, 52, 90, 0 and 1, respectively; the intersection of row 5 and each of columns 21, 25 and 26 of the parity-check matrix 900 includes a cyclic permutation matrix having a rotation of size 18, 68 and 0, respectively.

In some implementations, an LDPC encoder (such as the encoder 410 of FIG. 4) may use the parity-check matrix 900, or a generator matrix associated with the parity-check matrix 900, to encode 3402 systematic bits into codewords of length 3888, for example, to achieve a 7/8 code rate. The encoding process may generate 810 parity bits for every 3402 systematic bits, resulting in 4212 total codeword bits. In some implementations, the LDPC encoder may puncture 324 codeword bits of the 4212-bit codeword so that only the remaining 3888 codeword bits (representing a punctured codeword) are transmitted over a communications channel (such as the channel 420 of FIG. 4). In some aspects, the punctured bits may include the last 162 systematic bits of the LDPC codeword (corresponding to column 21 of the parity-check matrix 900, shown with shading in FIG. 9) and 162 parity bits from index 487 to index 648 (corresponding to column 25 of the parity-check matrix 900, shown with shading in FIG. 9), assuming the 810 parity bits have a starting index of 1. In some other aspects, the punctured bits may include any number of systematic bits, parity bits, or combination thereof.

Figure 10:
FIG. 10 shows another example parity-check matrix for an LDPC code.

FIG. 10 shows another example parity-check matrix 1000 for an LDPC code. In some implementations, the parity-check matrix 1000 may be derived from the base matrix of FIG. 8, where Z=324, M=6804, N=8424, and K=648. Thus, the parity-check matrix 1000 may be one example of the parity-check matrix 500 of FIG. 5. In some implementations, each entry in the parity-check matrix 1000 may correspond to a submatrix of dimension 324×324, where each "−1" entry represents an all-zero submatrix and each entry with a positive integer value (n) represents a cyclic permutation matrix having a circulant weight equal to 1 and a rotation of size n. With reference for example to FIG. 5, each "P" entry in the parity-check matrix 500 may be substituted for a 324×324 cyclic permutation matrix P(n) to produce the parity-check matrix 1000 of FIG. 10.

As shown in FIG. 10, the intersection of row 1 and each of columns 3-8, 11-15, 17-20, 22 and 25 of the parity-check matrix 1000 includes a cyclic permutation matrix having a rotation of size 193, 173, 175, 46, 18, 17, 266, 254, 207, 277, 2, 10, 305, 301, 249, 0 and 1, respectively; the intersection of row 2 and each of columns 1-7, 9-11, 13, 15-17, 19, and 21-23 of the parity-check matrix 1000 includes a cyclic permutation matrix having a rotation of size 258, 255, 7, 299, 81, 189, 124, 188, 243, 7, 129, 317, 29, 165, 231, 51, 0 and 0, respectively; the intersection of row 3 and each of columns 1, 2, 4, 5, 7-12, 14-16, 18, 20, 21, 23-25 of the parity-check matrix 1000 includes a cyclic permutation matrix having a rotation of size 236, 27, 170, 23, 129, 33, 111, 43, 155, 243, 100, 299, 130, 83, 0, 163, 0, 0 and 0, respectively; the intersection of row 4 and each of columns 1-3, 6, 8-10, 12-14, 16-21, 24 and 25 of the parity-check matrix 1000 includes a cyclic permutation matrix having a rotation of size 86, 191, 172, 82, 252, 121, 275, 121, 8, 72, 265, 207, 58, 106, 214, 90, 0 and 1, respectively; the intersection of row 5 and each of columns 21, 25 and 26 of the parity-check matrix 800 includes a cyclic permutation matrix having a rotation of size 180, 68 and 0, respectively.

In some implementations, an LDPC encoder (such as the encoder 410 of FIG. 4) may use the parity-check matrix 1000, or a generator matrix associated with the parity-check matrix 1000, to encode 6804 systematic bits into codewords of length 7776, for example, to achieve a 7/8 code rate. The encoding process may generate 1620 parity bits for every 6804 systematic bits, resulting in 8424 total codeword bits. In some implementations, the LDPC encoder may puncture 648 codeword bits of the 8424-bit codeword so that only the remaining 3888 codeword bits (representing a punctured codeword) are transmitted over a communications channel (such as the channel 420 of FIG. 4). In some aspects, the punctured bits may include the last 324 systematic bits of the LDPC codeword (corresponding to column 21 of the parity-check matrix 1000, shown with shading in FIG. 10) and 324 parity bits from index 973 to index 1296 (corresponding to column 25 of the parity-check matrix 1000, shown with shading in FIG. 10), assuming the 1620 parity bits have a starting index of 1. In some other aspects, the punctured bits may include any number of systematic bits, parity bits, or combination thereof.

Figure 11:
FIG. 11 shows another example parity-check matrix for an LDPC code.

FIG. 11 shows another example parity-check matrix 1100 for an LDPC code. In some implementations, the parity-check matrix 1100 may be derived from the base matrix of FIG. 8, where Z=648, M=13608, N=16848, and K=1296. Thus, the parity-check matrix 1100 may be one example of the parity-check matrix 500 of FIG. 5. In some implementations, each entry in the parity-check matrix 1100 may correspond to a submatrix of dimension 648×648, where each "−1" entry represents an all-zero submatrix and each entry with a positive integer value (n) represents a cyclic permutation matrix having a circulant weight equal to 1 and a rotation of size n. With reference for example to FIG. 5, each "P" entry in the parity-check matrix 500 may be substituted for a 648×648 cyclic permutation matrix P(n) to produce the parity-check matrix 1100 of FIG. 11.

As shown in FIG. 11, the intersection of row 1 and each of columns 3-8, 11-15, 17-20, 22 and 25 of the parity-check matrix 1100 includes a cyclic permutation matrix having a rotation of size 193, 173, 499, 370, 18, 17, 590, 254, 531, 277, 326, 10, 629, 301, 573, 0 and 1, respectively; the intersection of row 2 and each of columns 1-7, 9-11, 13, 15-17, 19, and 21-23 of the parity-check matrix 1100 includes a cyclic permutation matrix having a rotation of size 582, 255, 331, 299, 81, 513, 448, 188, 576, 7, 129, 641, 29, 489, 231, 51, 0 and 0, respectively; the intersection of row 3 and each of columns 1, 2, 4, 5, 7-12, 14-16, 18, 20, 21, 23-25 of the parity-check matrix 1100 includes a cyclic permutation matrix having a rotation of size 560, 351, 170, 23, 453, 33, 111, 43, 479, 567, 424, 299, 454, 407, 324, 163, 0, 0 and 0, respectively; the intersection of row 4 and each of columns 1-3, 6, 8-10, 12-14, 16-21, 24 and 25 of the parity-check matrix 1100 includes a cyclic permutation matrix having a rotation of size 86, 515, 496, 406, 576, 445, 599, 121, 332, 72, 589, 207, 382, 106, 214, 90, 0 and 1, respectively; the intersection of row 5 and each of columns 21, 25 and 26 of the parity-check matrix 1100 includes a cyclic permutation matrix having a rotation of size 180, 392 and 0, respectively.

In some implementations, an LDPC encoder (such as the encoder 410 of FIG. 4) may use the parity-check matrix 1100, or a generator matrix associated with the parity-check matrix 1100, to encode 13608 systematic bits into codewords of length 15552, for example, to achieve a 7/8 code rate. The encoding process may generate 3240 parity bits for every 13608 systematic bits, resulting in 16848 total codeword bits. In some implementations, the LDPC encoder may puncture 1296 codeword bits of the 16848-bit codeword so that only the remaining 15552 codeword bits (representing a punctured codeword) are transmitted over a communications channel (such as the channel 420 of FIG. 4). In some aspects, the punctured bits may include the last 648 systematic bits of the LDPC codeword (corresponding to column 21 of the parity-check matrix 1100, shown with shading in FIG. 11) and 648 parity bits from index 1945 to index 2592 (corresponding to column 25 of the parity-check matrix 1100, shown with shading in FIG. 11, assuming the 3240 parity bits have a starting index of 1. In some other aspects, the punctured bits may include any number of systematic bits, parity bits, or combination thereof.

Figure 12:
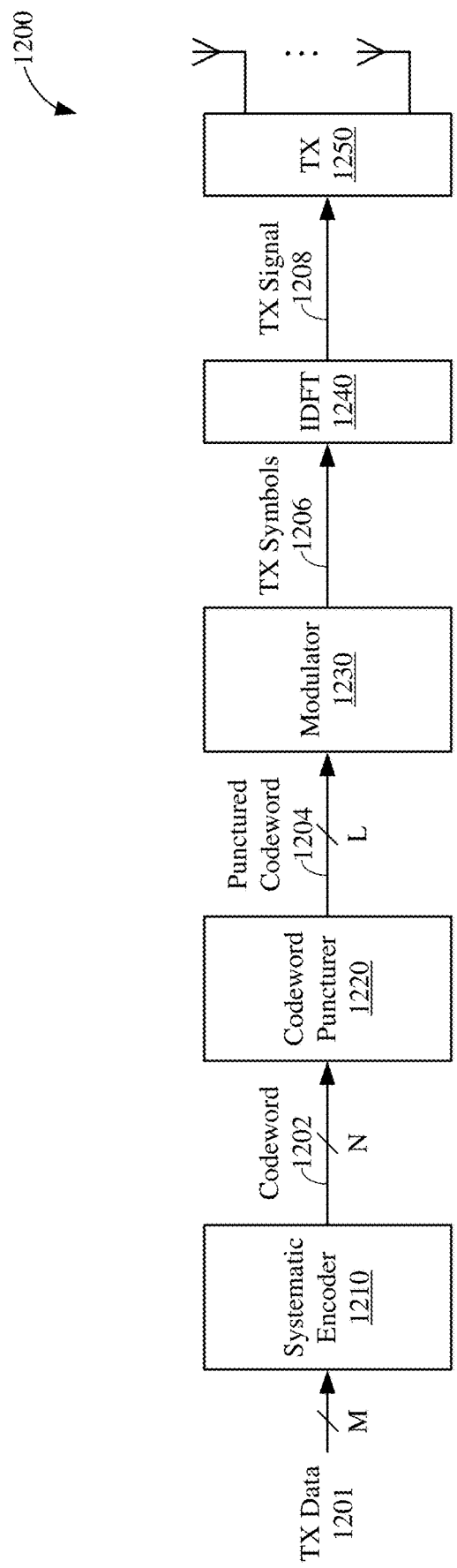
FIG. 12 shows an example transmit (TX) processing chain for a wireless communication device.

FIG. 12 shows an example transmit (TX) processing chain 1200 for a wireless communication device. The TX processing chain 1200 may be an example of one of the transceivers 210 or 310 of FIGS. 2 and 3, respectively. Thus, the TX processing chain 1200 may be configured to transmit TX data 1201 over a wireless communication channel. The TX processing chain 1200 includes a systematic encoder 1210, a codeword puncture 1220, a modulator 1230, an inverse discrete Fourier transform 1240, and a transmitter (TX) 1250. In some implementations, the TX processing chain 1200 may include additional components or circuitry not shown (for simplicity) in FIG. 12.

The systematic encoder 1210 performs a systematic encoding operation on a number (M) of bits of TX data 1201 to produce a number (N) of codeword bits representing a codeword 1202. In some implementations, the systematic encoding operation may be an LDPC encoding operation. As such, for each block of M bits of TX data 1201, the systematic encoder 1210 produces a resultant codeword 1202 that includes a systematic portion and a parity portion. The systematic portion includes the M bits of TX data 1201 (also referred to as systematic bits). The parity portion includes one or more parity bits which add redundancy to, and may be used in the decoding of, the codeword 1202. The length of the parity portion depends on the coding rate associated with the LDPC code used by the systematic encoder 1210 to perform the systematic encoding operation.

In some implementations, the systematic encoder 1210 may implement an LDPC code having a 5/6 coding rate. In other words, the systematic encoder 1210 may produce 6 codeword bits for every 5 bits of TX data 1201. In some aspects, the systematic encoder 1210 may implement an LDPC code that is described in existing versions of the IEEE 802.11 standard (also referred to herein as a "legacy" LDPC code). For example, the legacy LDPC code may be optimized for a 5/6 coding rate. In such implementations, the systematic encoder 1210 may perform the systematic encoding operation on blocks of 1620 bits of TX data 1201 (M=1620) to produce 1944-bit codewords 1202 (N=1944).

In some other implementations, the systematic encoder 1210 may implement an LDPC code that is optimized for higher coding rates (such as described with reference to FIGS. 5-11). In such implementations, the systematic encoder 1210 may perform the systematic encoding operation on blocks of 1701 bits of TX data 1201 or multiples thereof (such as M=3402, 6804, 13608, or 27216). The resulting codewords 1202 may include 2106 bits or multiples thereof (such as N=4212, 8424, 16848, or 33696).

The codeword puncturer 1220 punctures one or more bits of the codeword 1202 to produce a punctured codeword 1204. The punctured bits are not sent to the modulator 1230, and thus are not transmitted over the wireless channel. As a result, a length (L) of the punctured codeword 1204 is shorter than that of the codeword 1202 output by the systematic encoder 1210 (L<N). In some implementations, the codeword puncturer 1220 may puncture a number (K) of codeword bits to achieve an effective code rate (M/L) greater than 5/6. In some aspects, the codeword puncturer 1220 may puncture 93 bits of the codeword 1202 to achieve a code rate equal to 7/8 (such as when the systematic encoder 1210 implements a legacy LDPC code). In some other aspects, the codeword puncturer 1220 may puncture 162 bits of the codeword 1202, or a multiple thereof (such as K=324, 648, 1296, or 2592), to achieve an effective code rate equal to 7/8 (such as when the systematic encoder 1210 implements an LDPC code optimized for higher coding rates). Because punctured bits are not transmitted, the punctured codeword 1204 may include only the remaining (unpunctured) codeword bits (L=N−K).

The modulator 1230 modulates the punctured codeword 1204 onto a number of subcarriers to produce one or more TX symbols 1206. More specifically, the modulator 1230 maps one or more subset of bits of the punctured codeword 1204 to respective constellation points of a modulation constellation in accordance with a given modulation scheme. Each TX symbol 1206 has an amplitude and phase (representing a complex number) that describes a respective constellation point on the modulation constellation. Thus, each TX symbol 1206 represents a given number of bits of the punctured codeword 1204 depending a modulation order associated with the modulation scheme. For example, if the modulator 1230 implements a binary phase-shift keying (BPSK), each TX symbol 1206 would represent a single bit of TX data 1201. Further, if the modulator 1230 implements an m-ary quadrature amplitude modulation (m-QAM), each TX symbol 1206 would represent n bits of TX data 1201, where $m=2^n$.

In some implementations, the number (K) of codeword bits that are punctured by the codeword puncturer 1220 also may depend on the modulation order associated with the modulation scheme implemented by the modulator 1230. In some aspects, the number of punctured codeword bits may be a multiple of half the number of bits carried by an m-QAM symbol ($K=\alpha*n/2$, where a is an integer value and $m=2^n$). For example, if implementing a legacy LDPC code, the codeword puncturer 1220 may puncture 96 bits of the 1944-bit codeword 1202. The resulting punctured codeword 1204 has an effective code rate equal to 0.8766. Although fewer codeword bits are transmitted, puncturing 96 (rather than 93) bits of a 1944-bit codeword may be advantageous for some modulation schemes such as, for example, 4096-QAM (where each QAM symbol represents 12 bits of the punctured codeword 1204). As another example, the codeword puncturer 1220 may puncture 90 bits of the 1944-bit codeword 1202. As a result, each punctured codeword 1204 can be represented by 7.5 QAM symbols (for 4096-QAM), or every 2 punctured codewords 1204 can be represented by 15 QAM symbols.

The IDFT 1240 converts the TX symbols 1206 from the frequency domain to the time domain. For example, each IDFT 1240 may produce a respective series of time-domain samples representative of a sequence of TX symbols 1206. In some aspects, the series of samples output by the IDFT 1240 may be serialized by a parallel-to-serial converter (not shown for simplicity) to produce a time-varying TX signal 1208. The TX signal 1208 is provided to the transmitter 1250 for transmission, over a wireless channel, to a receiving device. In some aspects, the transmitter 1250 may include one or more power amplifiers (not shown for simplicity) to amplify the TX signal 1208 for transmission via one or more antennas.

Figure 13:
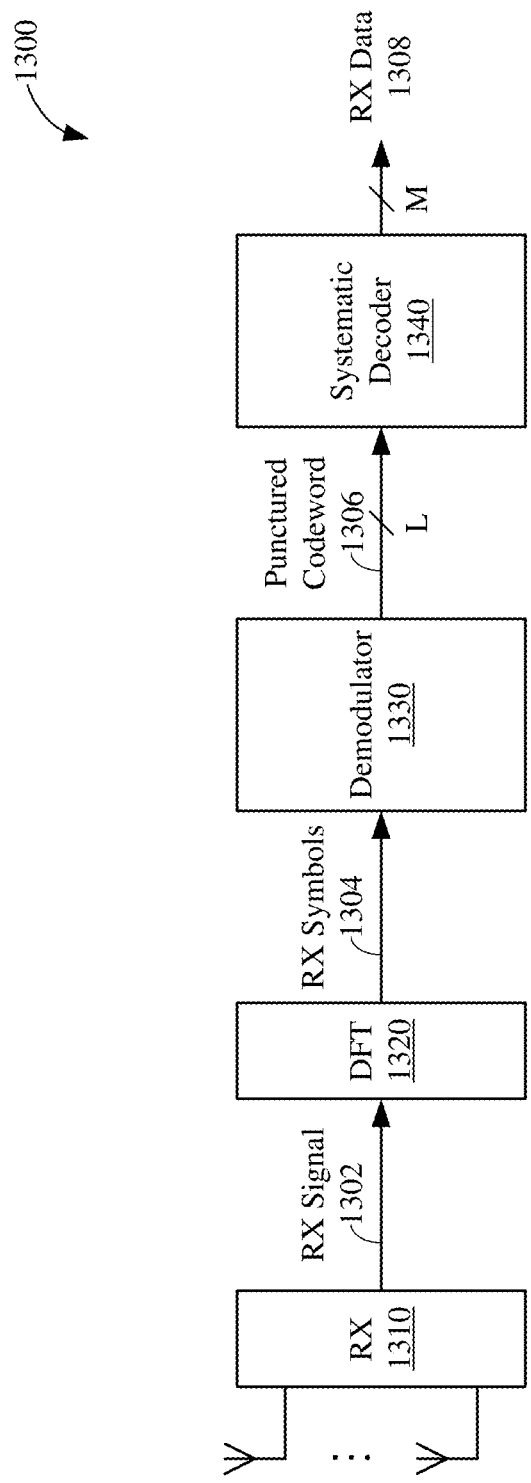
FIG. 13 shows an example receive (RX) processing chain for a wireless communication device.

FIG. 13 shows an example receive (RX) processing chain 1300 for a wireless communication device. The RX processing chain 1300 may be an example of one of the transceivers 210 or 310 of FIGS. 2 and 3, respectively. Thus, the RX processing chain 1300 may be configured to receive RX data 1308 over a wireless communication channel. The RX processing chain 1300 includes a receiver (RX) 1310, a discrete Fourier transform (DFT) 1320, a demodulator 1330, and a systematic decoder 1340. In some implementations, the RX processing chain 1300 may include additional components or circuitry not shown (for simplicity) in FIG. 13.

The receiver 1310 receives a time-domain RX signal 1302, over a wireless channel, from a transmitting device. In some aspects, the receiver 1310 may include one or more low noise amplifiers (LNAs) to amplify the received RX signal 1302. The DFT 1320 converts the RX signal 1302 from the time domain to the frequency domain. For example, the DFT 1320 may produce a sequence of RX symbols 1304 representative of the RX signal 1302. In some aspects, the symbol sequence output by the IDFT 1240 may be parallelized by a serial-to-parallel converter (not shown for simplicity) to produce the RX symbols 1304.

The demodulator 1330 demodulates the RX symbols 1304 to recover a punctured codeword 1306. In some implementations, the demodulator 1330 may be configured to reverse or undo the modulation performed by the modulator 1230 of FIG. 12. As described with reference to FIG. 12, each RX symbol 1304 has an amplitude and phase (representing a complex number) that describes a respective point on a modulation constellation associated with a given modulation scheme. Thus, each RX symbol 1304 represents a given number of bits of the punctured codeword 136 depending on a modulation order associated with the modulation scheme. The demodulator 1330 may de-map the constellation points associated with the RX symbols 1304 to recover a number (L) of bits representing the punctured codeword 1306.

The systematic decoder 1340 performs a systematic decoding operation on the punctured codeword 1306 to recover the RX data 1308. In some implementations, the systematic decoder 1340 may reverse or undo the systematic encoding operation performed by the systematic encoder 1210 of FIG. 12. For example, the systematic decoding operation may be an LDPC decoding operation. As described with reference to FIG. 12, the systematic encoder 1210 encodes M bits of TX data 1201 as an N-bit codeword 1202, and the codeword puncturer 1220 punctures K bits of the codeword 1202 to produce the punctured codeword 1204. In some implementations, the punctured codeword 1306 may be one example of the punctured codeword 1204. As such, the punctured codeword 1306 may be missing one or more punctured codeword bits (including systematic bits, parity bits, or any combination thereof) that would otherwise be included in the codeword 1202.

The systematic decoder 1340 may treat the missing bits as erasures and reconstruct the original codeword (including the punctured codeword bits) during the systematic decoding operation. In other words, as part of the LDPC decoding process, the systematic decoder 1340 may reconstruct the K punctured bits and add them to the L codeword bits of punctured codeword 1306 to reproduce a codeword of length N (where N=L+K). As described with reference to FIG. 12, the codeword includes a systematic portion and a parity portion. The systematic portion includes a number (M) of systematic bits representing the RX data 1308. The parity portion includes one or more parity bits that are added to the codeword for redundancy, and to assist with decoding. In some aspects, the systematic decoder 1340 may output only the M systematic bits as the recovered RX data 1308.

In some implementations, the systematic decoder 1340 may implement a legacy LDPC code. In such implementations, the systematic decoder 1340 may perform the systematic decoding operation on codewords of length 1944 to recover blocks of 1620 bits of RX data 1308 (M=1620). In some other implementations, the systematic decoder 1340 may implement an LDPC code that is optimized for higher coding rates (such as described with reference to FIGS. 5-11). In such implementations, the systematic decoder 1340 may perform the systematic decoding on codewords of length 2106, or multiples thereof (such as N=4212, 8424, 16848, or 33696), to recover blocks of 1701 bits of RX data 1308 or multiples thereof (such as M=3402, 6804, 13608, or 27216).

Figure 14:
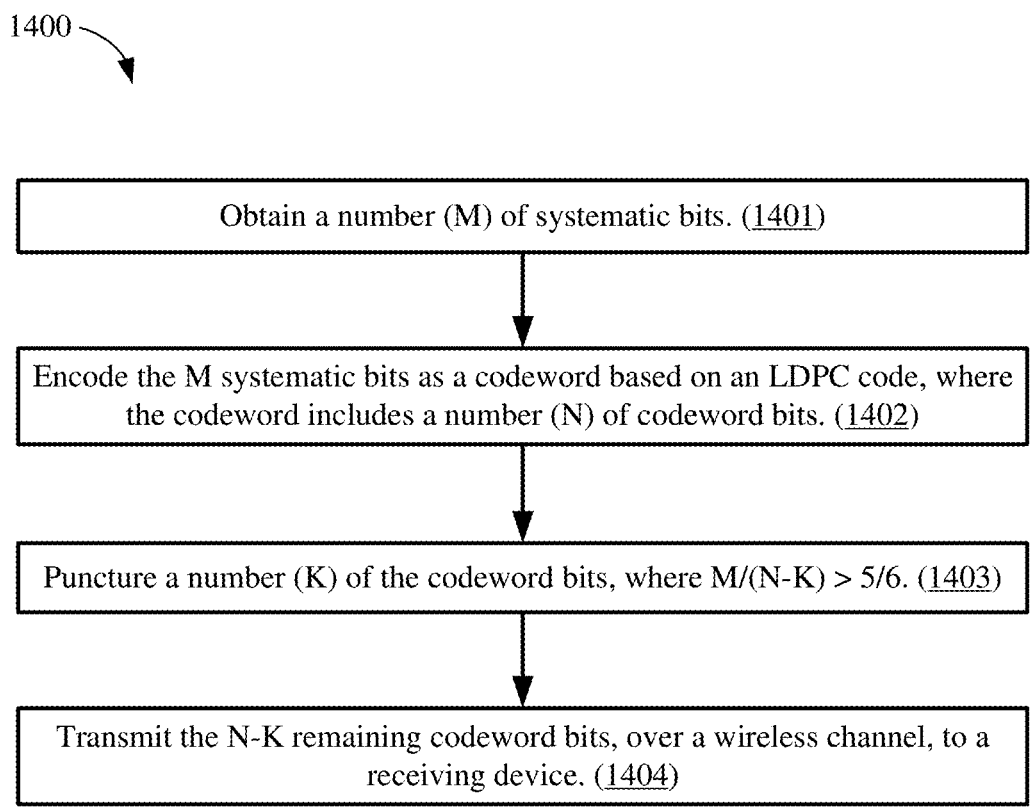
FIG. 14 shows an illustrative flowchart depicting an example wireless communication operation.

FIG. 14 shows an illustrative flowchart depicting an example operation 1400 for data encoding. The example operation 1400 may be performed by an LDPC encoder or a wireless communication device such as a STA or an AP. The AP may be the AP 110 of FIG. 1, the AP 300 of FIG. 3, or any other suitable AP. The STA may be any of the STAs 120a-120i of FIG. 1, the STA 200 of FIG. 2, or any other suitable STA.

The wireless communication device obtains a number (M) of systematic bits (1401). The wireless communication device encodes the systematic bits as a codeword based on an LDPC code, where the codeword includes a number (N) of codeword bits (1402). The wireless communication device punctures a number (K) of the codeword bits, where M/(N−K)>5/6 (1403). The wireless communication device transmits the N−K remaining codeword bits, over a wireless channel, to a receiving device (1404). The punctured codeword bits may include one or more systematic bits, one or more parity bits, or a combination thereof. In some implementations, the LDPC code may be a legacy LDPC code having a coding rate M/N=5/6. For example, the LDPC code may be used to encode 1620 systematic bits to produce codewords of length 1944, where 90 or more of the codeword bits are punctured. In some other implementations, the LDPC code may be a new LDPC code that is optimized for rate 7/8 encoding (such as described with respect to FIGS. 5-11).

Figure 15:
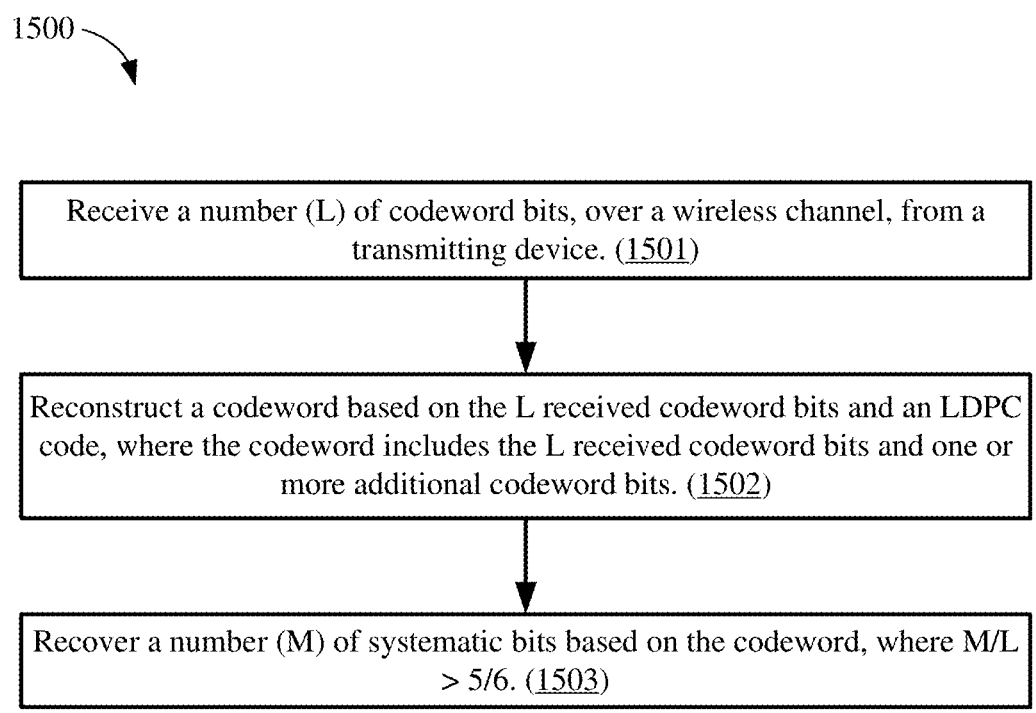
FIG. 15 shows an illustrative flowchart depicting an example wireless communication operation.

FIG. 15 shows an illustrative flowchart depicting an example operation 1500 for data encoding. The example operation 1500 may be performed by an LDPC encoder or a wireless communication device such as a STA or an AP. The AP may be the AP 110 of FIG. 1, the AP 300 of FIG. 3, or any other suitable AP. The STA may be any of the STAs 120a-120i of FIG. 1, the STA 200 of FIG. 2, or any other suitable STA.

The wireless communication device receives a number (L) of codeword bits, over a wireless channel, from a transmitting device (1501). The wireless communication device reconstructs a codeword based on the L received codeword bits and an LDPC code, where the codeword includes the L received codeword bits and one or more additional codeword bits (1502). The wireless communication device recovers a number (M) of systematic bits based on the codeword, where M/L>5/6 (1503). The one or more additional bits may include one or more systematic bits, one or more parity bits, or a combination thereof. In some implementations, the LDPC code may be a legacy LDPC code having a coding rate equal to 5/6. In some other implementations, the LDPC code may be a new LDPC code that is optimized for rate 7/8 encoding (such as described with respect to FIGS. 5-11).

Figure 16:
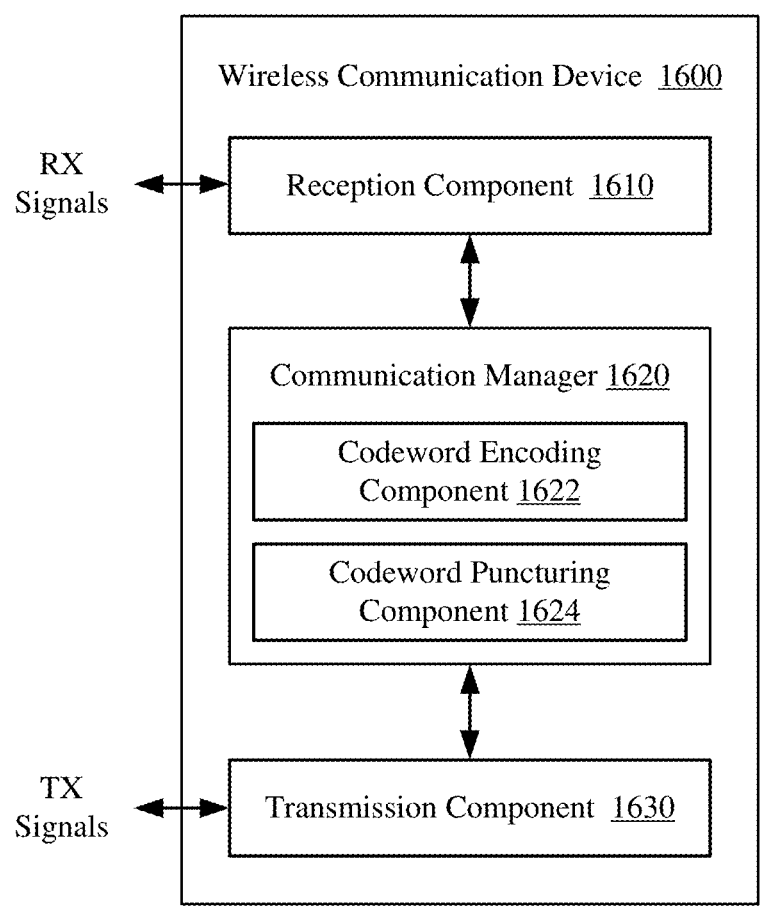
FIG. 16 shows a block diagram of an example wireless communication device.

FIG. 16 shows a block diagram of an example wireless communication device 1600. In some implementations, the wireless communication device 1600 may be configured to perform the process 1400 described above with reference to FIG. 14. The wireless communication device 1600 can be an example implementation of the STA 200 of FIG. 2 or the AP 300 of FIG. 3. For example, the wireless communication device 1600 can be a chip, SoC, chipset, package or device that includes at least one processor and at least one modem (for example, a Wi-Fi (IEEE 802.11) modem or a cellular modem).

The wireless communication device 1600 includes a reception component 1610, a communication manager 1620, and a transmission component 1630. The communication manager 1620 further includes a codeword encoding component 1622 and a codeword puncturing component 1624. Portions of one or more of the components 1622 and 1624 may be implemented at least in part in hardware or firmware. In some implementations, at least some of the components 1622 or 1624 are implemented at least in part as software stored in a memory (such as the memory 240 or the memory 330). For example, portions of one or more of the components 1622 and 1624 can be implemented as non-transitory instructions (or "code") executable by a processor (such as the processor 220 or the processor 320) to perform the functions or operations of the respective component.

The reception component 1610 is configured to receive RX signals, over a wireless channel, from one or more other wireless communication devices. The communication manager 1620 is configured to manage wireless communications with the one or more other wireless communication devices. In some implementations, the codeword encoding component 1622 may obtain a number (M) of systematic bits and encode the M systematic bits as a codeword based on an LDPC code, where the codeword includes a number (N) of codeword bits; and the codeword puncturing component 1624 may puncture a number (K) of the codeword bits, where M/(N−K)>5/6. The transmission component 1330 is configured to transmit TX signals, over the wireless channel, to the one or more other wireless communication devices. In some implementations, the TX signals may carry the N−K remaining codeword bits.

Figure 17:
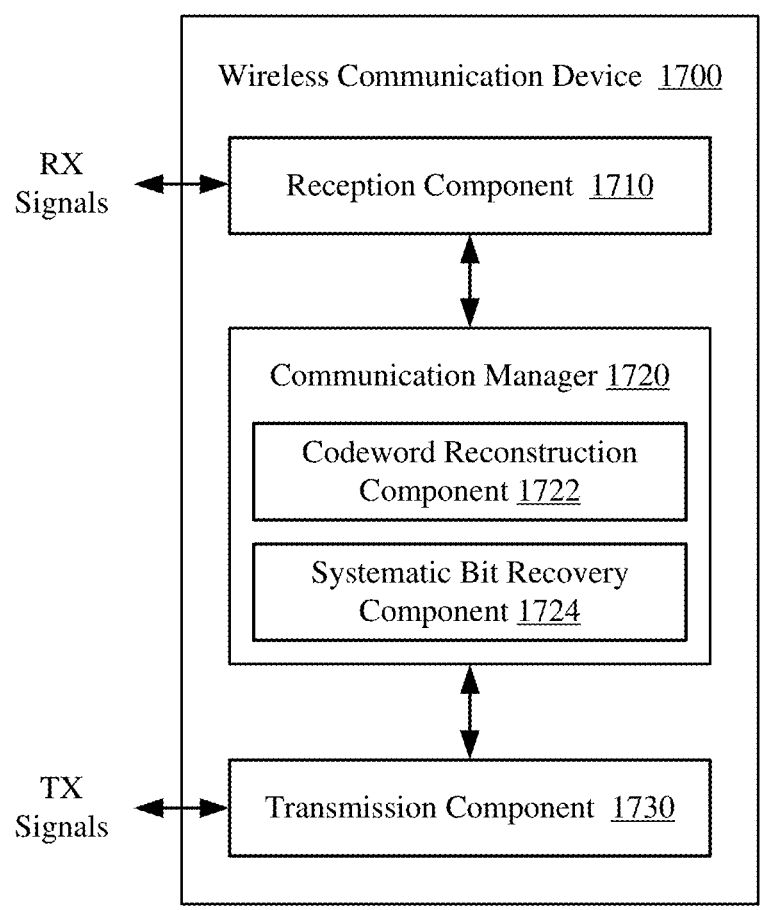
FIG. 17 shows a block diagram of an example wireless communication device.

FIG. 17 shows a block diagram of an example wireless communication device 1700. In some implementations, the wireless communication device 1700 may be configured to perform the process 1500 described above with reference to FIG. 15. The wireless communication device 1700 can be an example implementation of the STA 200 of FIG. 2 or the AP 300 of FIG. 3. For example, the wireless communication device 1700 can be a chip, SoC, chipset, package or device that includes at least one processor and at least one modem (for example, a Wi-Fi (IEEE 802.11) modem or a cellular modem).

The wireless communication device 1700 includes a reception component 1710, a communication manager 1720, and a transmission component 1730. The communication manager 1720 further includes a codeword reconstruction component 1722 and a systematic bit recovery component 1724. Portions of one or more of the components 1722 and 1724 may be implemented at least in part in hardware or firmware. In some implementations, at least some of the components 1722 or 1724 are implemented at least in part as software stored in a memory (such as the memory 240 or the memory 330). For example, portions of one or more of the components 1722 and 1724 can be implemented as non-transitory instructions (or "code") executable by a processor (such as the processor 220 or the processor 320) to perform the functions or operations of the respective component.

The reception component 1710 is configured to receive RX signals, over a wireless channel, from one or more other wireless communication devices. In some implementations, the RX signals may carry a number (L) of codeword bits. The communication manager 1720 is configured to manage wireless communications with the one or more other wireless communication devices. In some implementations, the codeword reconstruction component 1722 may reconstruct a codeword based on the L received codeword bits and an LDPC code, where the codeword includes the L received codeword bits and one or more additional codeword bits; and the systematic bit recovery component 1724 may recover a number (M) of systematic bits based on the codeword, where M/L>5/6. The transmission component 1330 is configured to transmit TX signals, over the wireless channel, to the one or more other wireless communication devices.

Implementation examples are described in the following numbered clauses:

1. A method of wireless communication performed by a wireless communication device, including:
    obtaining a number (M) of systematic bits;
    encoding the M systematic bits as a codeword based on a low-density parity-check (LDPC) code, the codeword including a number (N) of codeword bits;
    puncturing a number (K) of the codeword bits, where M/(N−K)>5/6; and
    transmitting the N−K remaining codeword bits, over a wireless channel, to a receiving device.

2. The method of clause 1, where M/(N−K)=7/8.

3. The method of any of clauses 1 or 2, where the K punctured codeword bits include one or more systematic bits, one or more parity bits, or a combination thereof.

4. The method of any of clauses 1-3, further including:
    modulating the N−K remaining codeword bits in accordance with a modulation scheme, the number K of punctured codeword bits being based on a modulation order associated with the modulation scheme.

5. The method of any of clauses 1-4, where M/N=5/6.

6. The method of any of clauses 1-5, where M=1620, N=1944, and K≥90.

7. The method of any of clauses 1-4, where M is a multiple of 1701, N is a multiple of 2106, and K is a multiple of 162.

8. The method of any of clauses 1-4 or 7, where the LDPC code is associated with a base matrix including 5 rows and 24 columns, an intersection of each row and column of the base matrix representing a respective submatrix of dimension Z×Z.

9. The method of any of clauses 1-4, 7 or 8, where:
the intersection of row 1 and each of columns 1, 2, 9, 10, 16, 21, 23, 24, and 26 of the base matrix includes an all-zero submatrix;
the intersection of row 2 and each of columns 8, 12, 14, 18, 20, and 24-26 of the base matrix includes an all-zero submatrix;
the intersection of row 3 and each of columns 3, 6, 13, 17, 19, 22, and 26 of the base matrix includes an all-zero submatrix;
the intersection of row 4 and each of columns 4, 5, 7, 11, 15, 22, 23, and 26 of the base matrix includes an all-zero submatrix; and
the intersection of row 5 and each of columns 1-20 and 22-24 of the base matrix includes an all-zero submatrix.

10. The method of any of clauses 1-4 or 7-9, where each of the remaining submatrices of the base matrix includes a cyclic permutation matrix.

11. A wireless communication device including:
one or more processors; and
a memory coupled to the one or more processors and including instructions that, when executed by the one or more processors, cause the wireless device to perform the method of any one or more of clauses 1-10.

12. A method of wireless communication performed by a wireless communication device, including:
receiving a number (L) of codeword bits, over a wireless channel, from a transmitting device;
reconstructing a codeword based on the L received codeword bits and a low-density parity-check (LDPC) code, the codeword including the L received codeword bits and one or more additional codeword bits; and
recovering a number (M) of systematic bits based on the codeword, where M/L>5/6.

13. The method of clause 12, where M/L=7/8.

14. The method of any of clauses 12 or 13, where the one or more additional codeword bits include one or more systematic bits, one or more parity bits, or a combination thereof.

15. The method of any of clauses 12-14, where the LDPC code is associated with a code rate equal to 5/6.

16. The method of any of clauses 12-14, where the LDPC code is associated with a base matrix including 5 rows and 24 columns, an intersection of each row and column of the base matrix representing a respective submatrix of dimension Z×Z.

17. The method of any of clauses 12-14 or 16, where:
the intersection of row 1 and each of columns 1, 2, 9, 10, 16, 21, 23, 24, and 26 of the base matrix includes an all-zero submatrix;
the intersection of row 2 and each of columns 8, 12, 14, 18, 20, and 24-26 of the base matrix includes an all-zero submatrix;
the intersection of row 3 and each of columns 3, 6, 13, 17, 19, 22, and 26 of the base matrix includes an all-zero submatrix;
the intersection of row 4 and each of columns 4, 5, 7, 11, 15, 22, 23, and 26 of the base matrix includes an all-zero submatrix; and
the intersection of row 5 and each of columns 1-20 and 22-24 of the base matrix includes an all-zero submatrix.

18. The method of any of clauses 12-14, 16 or 17, where each of the remaining submatrices of the base matrix includes a cyclic permutation matrix.

19. The method of any of clauses 12-14 or 16-18, where Z is a multiple of 81.

20. A wireless communication device including:
one or more processors; and
a memory coupled to the one or more processors and including instructions that, when executed by the one or more processors, cause the wireless device to perform the method of any one or more of clauses 12-19.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or any conventional processor, controller, microcontroller, or state machine. A processor also may be implemented as a combination of computing devices such as, for example, a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method of wireless communication performed by a wireless communication device, comprising:
    obtaining a number (M) of systematic bits;
    encoding the M systematic bits as a codeword including a number (N) of codeword bits, the codeword being encoded according to a low-density parity-check (LDPC) code represented by a base matrix including 5 rows and 26 columns, where:
        the intersection of row 1 and each of columns 1, 2, 9, 10, 16, 21, 23, 24, and 26 of the base matrix is an all-zero submatrix including a number (Z) of rows and Z columns;
        the intersection of row 2 and each of columns 8, 12, 14, 18, 20, and 24-26 of the base matrix is an all-zero submatrix including Z rows and Z columns;
        the intersection of row 3 and each of columns 3, 6, 13, 17, 19, 22, and 26 of the base matrix is an all-zero submatrix including Z rows and Z columns;
        the intersection of row 4 and each of columns 4, 5, 7, 11, 15, 22, 23, and 26 of the base matrix is an all-zero submatrix including Z rows and Z columns; and
        the intersection of row 5 and each of columns 1-20 and 22-24 of the base matrix is an all-zero submatrix including Z rows and Z columns;
    puncturing a number (K) of the codeword bits, where M/(N−K)>5/6; and
    transmitting the N−K remaining codeword bits, over a wireless channel, to a receiving device.

2. The method of claim 1, wherein M/(N−K)=7/8.

3. The method of claim 1, wherein the K punctured codeword bits include one or more systematic bits, one or more parity bits, or a combination thereof.

4. The method of claim 1, further comprising:
    modulating the N−K remaining codeword bits in accordance with a modulation scheme, the number K of punctured codeword bits being based on a modulation order associated with the modulation scheme.

5. The method of claim 1, wherein M is a multiple of 1701, N is a multiple of 2106, and K is a multiple of 162.

6. The method of claim 1, wherein each of the remaining submatrices of the base matrix comprises a cyclic permutation matrix including Z rows and Z columns.

7. The method of claim 1, wherein Z is a multiple of 81.

8. A wireless communication device comprising:
    one or more processors; and
    a memory coupled to the one or more processors and including instructions that, when executed by the one or more processors, cause the wireless device to:
        obtain a number (M) of systematic bits;
        encode the M systematic bits as a codeword including a number (N) of codeword bits, the codeword being associated with a low-density parity-check (LDPC) code represented by a base matrix including 5 rows and 26 columns, where:
            the intersection of row 1 and each of columns 1, 2, 9, 10, 16, 21, 23, 24, and 26 of the base matrix is an all-zero submatrix including a number (Z) of rows and Z columns;
            the intersection of row 2 and each of columns 8, 12, 14, 18, 20, and 24-26 of the base matrix is an all-zero submatrix including Z rows and Z columns;
            the intersection of row 3 and each of columns 3, 6, 13, 17, 19, 22, and 26 of the base matrix is an all-zero submatrix including Z rows and Z columns;
            the intersection of row 4 and each of columns 4, 5, 7, 11, 15, 22, 23, and 26 of the base matrix is an all-zero submatrix including Z rows and Z columns; and the intersection of row 5 and each of columns 1-20 and 22-24 of the base matrix is an all-zero submatrix including Z rows and Z columns;
puncture a number (K) of the codeword bits, where M/(N−K)>5/6; and
transmit the N−K remaining codeword bits, over a wireless channel, to a receiving device.

9. The wireless communication device of claim 8, wherein Z is a multiple of 81.

10. The wireless communication device of claim 8, wherein execution of the instructions further causes the wireless communication device to:
modulate the N−K remaining codeword bits in accordance with a modulation scheme, the number K of punctured codeword bits being based on a modulation order associated with the modulation scheme.

11. The wireless communication device of claim 8, wherein M is a multiple of 1701, N is a multiple of 2106, K is a multiple of 162, and M/(N−K)=7/8.

12. The wireless communication device of claim 8, wherein each of the remaining submatrices of the base matrix comprises a cyclic permutation matrix including Z rows and Z columns.

13. A method of wireless communication performed by a wireless communication device, comprising:
receiving a number (L) of codeword bits, over a wireless channel, from a transmitting device;
reconstructing a codeword including the L received codeword bits and one or more additional codeword bits, the codeword being reconstructed according to a low-density parity-check (LDPC) code represented by a base matrix including 5 rows and 26 columns, where:
the intersection of row 1 and each of columns 1, 2, 9, 10, 16, 21, 23, 24, and 26 of the base matrix is an all-zero submatrix including a number (Z) of rows and Z columns;
the intersection of row 2 and each of columns 8, 12, 14, 18, 20, and 24-26 of the base matrix is an all-zero submatrix including Z rows and Z columns;
the intersection of row 3 and each of columns 3, 6, 13, 17, 19, 22, and 26 of the base matrix is an all-zero submatrix including Z rows and Z columns;
the intersection of row 4 and each of columns 4, 5, 7, 11, 15, 22, 23, and 26 of the base matrix is an all-zero submatrix including Z rows and Z columns; and
the intersection of row 5 and each of columns 1-20 and 22-24 of the base matrix is an all-zero submatrix including Z rows and Z columns; and
recovering a number (M) of systematic bits associated with the codeword, where M/L>5/6.

14. The method of claim 13, wherein M/L=7/8.

15. The method of claim 13, wherein the one or more additional codeword bits include one or more systematic bits, one or more parity bits, or a combination thereof.

16. The method of claim 13, wherein each of the remaining submatrices of the base matrix comprises a cyclic permutation matrix including Z rows and Z columns.

17. The method of claim 13, wherein Z is a multiple of 81.

18. A wireless communication device comprising:
one or more processors; and
a memory coupled to the one or more processors and including instructions that, when executed by the one or more processors, cause the wireless device to:
receive a number (L) of codeword bits, over a wireless channel, from a transmitting device;
reconstruct a codeword including the L received codeword bits and one or more additional codeword bits, the codeword being reconstructed according to a low-density parity-check (LDPC) code represented by a base matrix including 5 rows and 26 columns, where:
the intersection of row 1 and each of columns 1, 2, 9, 10, 16, 21, 23, 24, and 26 of the base matrix is an all-zero submatrix including a number (Z) of rows and Z columns;
the intersection of row 2 and each of columns 8, 12, 14, 18, 20, and 24-26 of the base matrix is an all-zero submatrix including Z rows and Z columns;
the intersection of row 3 and each of columns 3, 6, 13, 17, 19, 22, and 26 of the base matrix is an all-zero submatrix including Z rows and Z columns;
the intersection of row 4 and each of columns 4, 5, 7, 11, 15, 22, 23, and 26 of the base matrix is an all-zero submatrix including Z rows and Z columns; and
the intersection of row 5 and each of columns 1-20 and 22-24 of the base matrix is an all-zero submatrix including Z rows and Z columns; and
recover a number (M) of systematic bits based on the codeword, where M/L>5/6.

19. The wireless communication device of claim 18, wherein each of the remaining submatrices of the base matrix comprises a cyclic permutation matrix including Z rows and Z columns.

20. The wireless communication device of claim 18, wherein Z is a multiple of 81.

* * * * *